(12) United States Patent
Sato et al.

(10) Patent No.: US 9,075,110 B2
(45) Date of Patent: Jul. 7, 2015

(54) FAULT DETECTION SYSTEM, ACQUISITION APPARATUS, FAULT DETECTION METHOD, PROGRAM, AND NON-TRANSITORY COMPUTER-READABLE MEDIUM

(75) Inventors: Yasuo Sato, Iizuka (JP); Seiji Kajihara, Iizuka (JP)

(73) Assignee: KYUSHU INSTITUTE OF TECHNOLOGY, Fukuoka (JP)

( * ) Notice: Subject to any disclaimer, the term of this patent is extended or adjusted under 35 U.S.C. 154(b) by 154 days.

(21) Appl. No.: 13/877,601

(22) PCT Filed: Sep. 28, 2011

(86) PCT No.: PCT/JP2011/072211
§ 371 (c)(1),
(2), (4) Date: Apr. 3, 2013

(87) PCT Pub. No.: WO2012/046602
PCT Pub. Date: Apr. 12, 2012

(65) Prior Publication Data
US 2013/0205180 A1    Aug. 8, 2013

(30) Foreign Application Priority Data
Oct. 5, 2010   (JP) ................................. 2010-225318

(51) Int. Cl.
*G01R 31/3185* (2006.01)
*G01R 31/3177* (2006.01)

(52) U.S. Cl.
CPC .... *G01R 31/3177* (2013.01); *G01R 31/318547* (2013.01); *G01R 31/318566* (2013.01)

(58) Field of Classification Search
CPC ................ G01R 31/318533; G01R 31/318563
USPC ................................................... 714/726–731
See application file for complete search history.

(56) References Cited

U.S. PATENT DOCUMENTS 5,276,893 A * 1/1994 Savaria ........................... 714/10
5,485,473 A * 1/1996 Diebold et al. ............... 714/724
(Continued)

FOREIGN PATENT DOCUMENTS

CN          1722307          1/2006
JP       2005-134180         5/2005
(Continued)

OTHER PUBLICATIONS

Chih-Jen Lin et al. "PSBIST: A Partial-Scan Based Built-In Self-Test Scheme" International Test Conference, IEEE, 1993, Paper 22.3, pp. 507-516, total 10 pages.
(Continued)

*Primary Examiner* — Steve Nguyen
(74) *Attorney, Agent, or Firm* — Rankin, Hill & Clark LLP

(57)    ABSTRACT

It is a purpose of the invention to provide a fault detection system, etc., having improved fault coverage with a reduced number of test patterns to be input to a logic circuit. The fault detection system detects a fault in a logic circuit based on multiple output logic values of the logic circuit after a test input pattern is input. The output logic values are input to the logic circuit as an updated test input pattern. The system comprises: a first acquisition unit which acquires a part of or all of the output logic values; a comparison unit which compares the logic values acquired by the first acquisition unit with those predicted for when there are no faults, or for when there is a specific fault; and a fault judgment unit which judges whether or not there is a fault based on the comparison result obtained by the comparison unit.

12 Claims, 18 Drawing Sheets

(56) References Cited

U.S. PATENT DOCUMENTS

| | | | |
|---|---|---|---|
| 5,550,843 A * | 8/1996 | Yee | 714/726 |
| 6,662,325 B1 * | 12/2003 | Golshan | 714/726 |
| 6,944,067 B2 * | 9/2005 | Mudge et al. | 365/189.07 |
| 7,007,214 B2 * | 2/2006 | Eustis et al. | 714/729 |
| 7,734,973 B2 * | 6/2010 | Hiraide et al. | 714/729 |
| 8,819,507 B2 * | 8/2014 | Luu et al. | 714/726 |
| 8,843,795 B2 * | 9/2014 | Nakaya | 714/725 |
| 2003/0070127 A1 * | 4/2003 | Kusko et al. | 714/726 |
| 2005/0097415 A1 | 5/2005 | Hamada | |
| 2005/0289423 A1 | 12/2005 | Yabuta | |
| 2006/0041806 A1 | 2/2006 | Okada et al. | |
| 2010/0026334 A1 * | 2/2010 | Halberla et al. | 324/765 |
| 2013/0205180 A1 * | 8/2013 | Sato et al. | 714/727 |

FOREIGN PATENT DOCUMENTS

| | | |
|---|---|---|
| JP | 2006-012234 | 1/2006 |
| JP | 2006-058152 | 3/2006 |
| TW | 291032 | 12/2007 |

OTHER PUBLICATIONS

International Search Report of Nov. 1, 2011 filed in PCT/JP2011/07211.

* cited by examiner

Fig.9
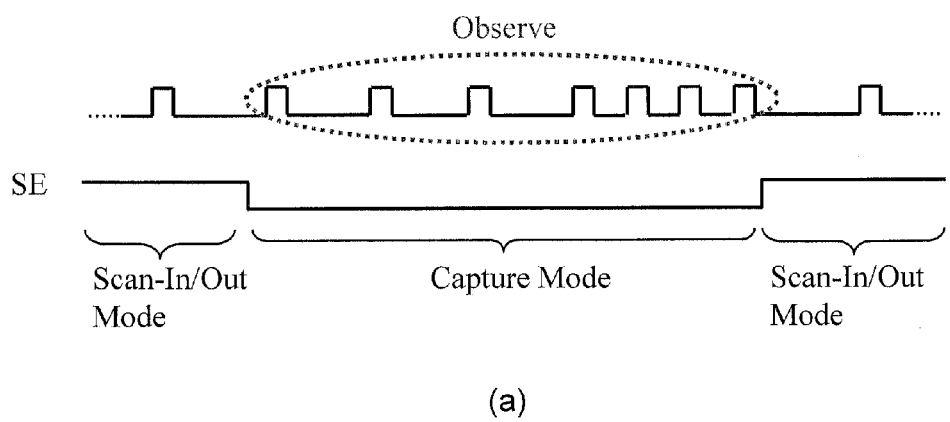
(a)
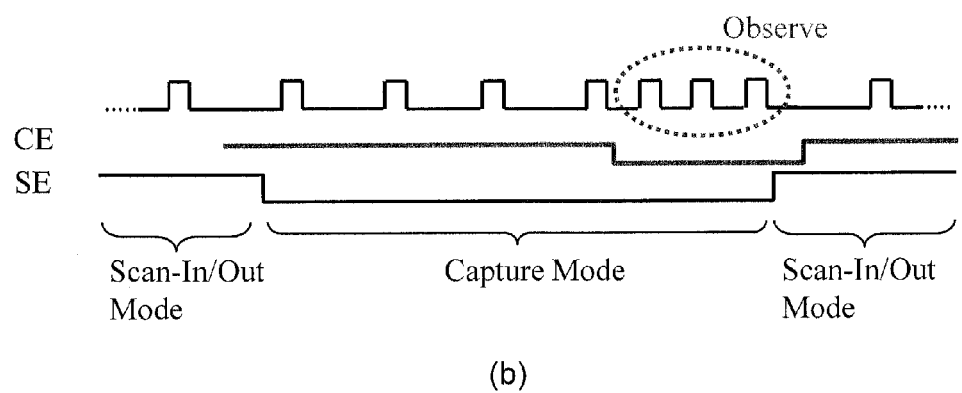
(b)

Fig.11

| Circuit Name | Observation methods & Ratio | | | | |
|---|---|---|---|---|---|
| | --- | | Sim-based | SCOAP | Random |
| | 0% | 100% | 20% | 20% | 20% |
| s5378 | 48.30 | 65.05 | 64.74 | 63.00 | 53.47 |
| s9234 | 59.09 | 64.88 | 64.88 | 60.40 | 59.39 |
| s13207 | 61.40 | 65.86 | 65.85 | 63.98 | 62.20 |
| s15850 | 68.61 | 72.76 | 72.76 | 71.06 | 70.41 |
| s38417 | 81.67 | 84.23 | 84.23 | 83.33 | 83.28 |
| s38584 | 80.90 | 82.20 | 82.19 | 81.58 | 81.12 |
| Average | 66.66 | 72.50 | 72.44 | 70.56 | 68.31 |

Fig.12

| Circuit | Sim-based (sec) | SCOAP (sec) |
|---|---|---|
| s5378 | 1.67 | 0.03 |
| s9234 | 3.86 | 0.06 |
| s13207 | 8.60 | 0.18 |
| s15850 | 11.86 | 0.20 |
| s38417 | 73.34 | 1.08 |
| s38584 | 89.23 | 1.57 |

$FF_1,,,, FF_m$    $p^{th}$ XOR tree    n-bit MISR

Fig.18 --Prior Art--
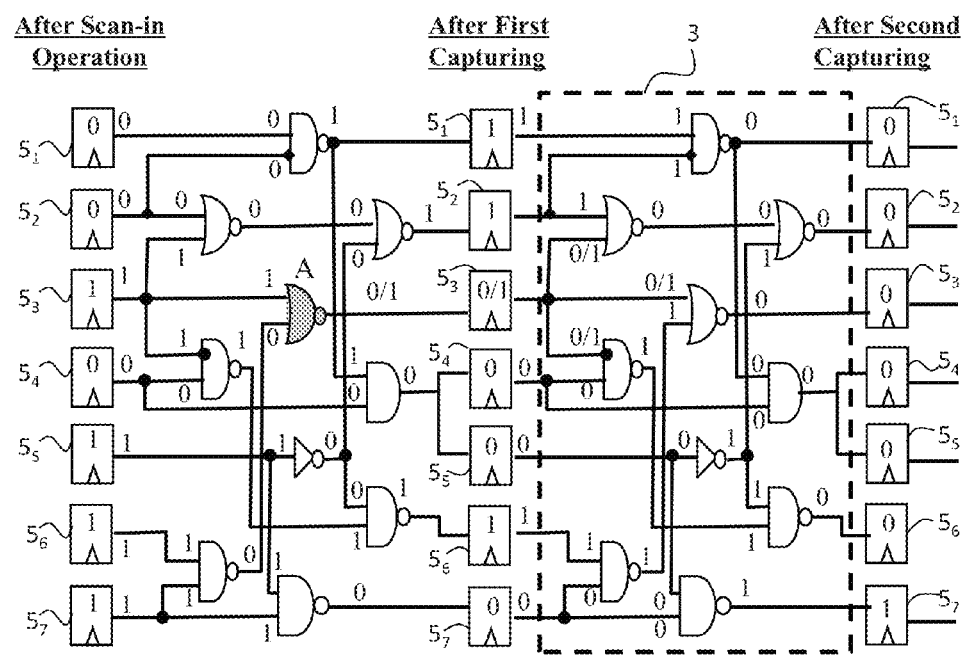

FAULT DETECTION SYSTEM, ACQUISITION APPARATUS, FAULT DETECTION METHOD, PROGRAM, AND NON-TRANSITORY COMPUTER-READABLE MEDIUM

TECHNICAL FIELD

The present invention relates to a fault detection system, an acquisition apparatus, a fault detection method, a program, and a recording medium, and particularly to a fault detection system and the like configured to detect a fault of a logic circuit based on multiple output logic values output from the logic circuit after a test input pattern is input to the logic circuit.

BACKGROUND ART

In recent years, as the scale of a semiconductor logic circuit has become large, the number of test input patterns required to test such a semiconductor integrated circuit has become great. However, such a semiconductor logic circuit has a limited storage capacity for storing test input patterns to be used in a system test which is to be executed after such a semiconductor integrated circuit is built into a system, or a field test or the like which is to be executed after shipping. In order to solve such a problem, it is important to provide high fault coverage with a small amount of data to be stored.

Here, description will be made regarding a semiconductor integrated circuit to be tested. In many cases, typical semiconductor logic circuits are each configured as a sequential circuit. Such a sequential circuit includes a combinational circuit portion comprising logic elements such as AND gates, NAND gates, OR gates, NOR gates, and the like, and flip-flops (FF) configured to store the internal state of the circuit. In this case, such a combinational circuit portion includes primary input lines (PI), pseudo primary input lines (PPI) each configured as an output line of a corresponding flip-flop, primary output lines (PO), and pseudo primary output lines (PPO) each configured as an input line of a corresponding flip-flop. In an input operation in which a signal is input to the combinational circuit portion, a part of the input operation is performed directly via a primary input line, and the other part of the input operation is performed indirectly via a pseudo primary input line. Furthermore, in an output operation in which a signal is output from the combinational circuit portion, a part of the output operation is performed directly via a primary output line, and the other part of the output operation is performed indirectly via a pseudo primary output line.

In order to test such a combinational circuit portion included in the sequential circuit, there is a need to input a predetermined test input pattern via such primary input lines and pseudo primary input lines of the combinational circuit portion, and to acquire a test response signal from the combinational circuit portion via the primary output lines and the pseudo primary output lines.

However, with such a sequential circuit, typically, it is not possible for an external circuit to directly access the output lines of the flip-flops (pseudo primary input lines) and the input lines (pseudo primary output lines) of the flip-flops. Thus, a test for such a combinational circuit requires controllability of the pseudo primary input lines, and requires observability of the pseudo primary output lines, which is a problem.

As a major method for solving such a problem of controllability and observability in the combinational circuit portion test, a full scan method based on a full scan design is known. With such a full scan design, the flip-flops are each configured as a scan flip-flop, and a single or multiple scan chains are formed using the scan flip-flops. The operation of each scan flip-flop is controlled via a corresponding scan enable (SE) signal line. For example, when SE=0, the flip-flop performs the same operation as that of a conventional flip-flop. In this state, upon receiving a clock pulse, the output value of the scan flip-flop is set to the value output from the combinational circuit portion, thereby updating the output value of the scan flip-flop. On the other hand, when SE=1, the scan flip-flop forms a single shift register together with the other scan flip-flops included in the same scan chain. In this state, upon receiving a clock pulse, an updated value received from the outside is scanned in to the scan flip-flop. At the same time, a value held by the scan flip-flop is scanned out to outside the flip-flop. Typically, the scan flip-flops included in the same scan chain are configured to share a common scan enable signal line. It should be noted that, in some cases, different scan chains share a single scan enable line. Otherwise, such different scan chains have different respective scan enable signal lines.

Referring to FIG. 14, further description will be made regarding a conventional scan test. FIG. 14 is a diagram showing a test cycle of a scan test.

A test for a combinational circuit portion of a full scan sequential circuit is performed by repeatedly executing a scan shift operation and a scan capture operation. The scan shift operation is performed in a shift mode in which SE=1. In the shift mode, one or multiple clock pulses are supplied, and one or multiple updated values are scanned in from the outside to the scan flip-flops included within the scan chain. Furthermore, at the same time, one or multiple values held by the scan flip-flops included within the scan chain are scanned out to the outside. The scan capture operation is performed in the capture mode in which SE=0. In the capture mode, a single clock pulse is supplied at the same time to all the scan flip-flops included within the scan chain, and the values output via the pseudo primary output lines of the combinational circuit portion are acquired and held by all the scan flip-flops.

The scan shift operation is used to input a test input pattern to the combinational circuit portion via the pseudo primary input lines, and to acquire a test response signal from the combinational circuit portion via the pseudo primary output lines. On the other hand, the scan capture operation is used for the scan flip-flops to acquire and hold a test response from the combinational circuit portion. Such a scan shift operation and such a scan capture operation are repeatedly performed for all the test input patterns, thereby allowing the combinational circuit portion to be tested.

Next, referring to FIG. 15, description will be made regarding fault detection using a conventional scan test. FIG. 15 is a block diagram showing a fault detection system 101 using a background technique of the present invention.

The fault detection system 101 includes an acquisition apparatus 107, a judgment apparatus 111, and a pattern control apparatus 113. The acquisition apparatus 107 includes an acquisition unit 117 and a storage unit 121. The judgment apparatus 111 includes a comparison unit 129 and a fault judgment unit 131. The pattern control apparatus 113 includes a test input pattern holding unit 133, an expanding circuit 135, and a compressing circuit 137.

With the scan test method, a part of the test input pattern input operation is performed directly via a primary input port, and the other part of the test input pattern input operation is performed indirectly via the scan shift operation. Such a scan shift operation allows a desired logic value to be set for a desired scan flip-flop, thereby solving a problem of controllability of the pseudo primary input lines. Moreover, a part of the test response acquisition from the combinational circuit portion 3 is performed directly via a primary output port, and the other part of the test response acquisition is performed indirectly via the scan shift operation. The scan shift operation allows the acquisition unit 117 to acquire the output value of a desired scan flip-flop, thereby solving a problem of observability of the pseudo primary output lines. It should be noted that, typically, the number of scan flip-flops is the same as the number of pseudo primary output lines. The comparison unit 129 compares the acquired values with the values predicted for when the combinational circuit portion 3 operates normally. The fault judgment unit 131 judges based on the judgment result whether or not there is a fault in the combinational circuit portion 3.

Typically, in a case of performing a system test or a field test for such a semiconductor integrated circuit, built-in self-test (BIST) is performed. In particular, the GIST has a problem of a limited storage capacity for storing a test input pattern. Thus, various techniques have been developed for reducing the amount of test data.

Examples of such a method include a method in which a test input pattern is compressed, and the compressed test input pattern is used as a seed pattern (seed). The seed is expanded before a scan-in operation. Furthermore, a seed is obtained by compression and scan-out operation. Thus, such an arrangement allows the amount of test data to be reduced. However, as the scale of semiconductor integrated circuits has become large, there has been an increased demand for a technique for further reducing the amount of test data.

Now, referring to FIGS. 16 and 17, description will be made regarding a multiple capture method described in Non-patent document 1. The multiple capture method is employed to maintain the fault coverage even if the partial scan design is employed. FIG. 16 is a diagram showing a test cycle using the multiple capture method. FIG. 17 is a flowchart showing a procedure in a case of employing a conventional multiple capture method.

With such a partial scan design, the number of flip-flops designed as the scan flip-flops is reduced, thereby reducing the circuit size. However, such an arrangement has a problem in that the input logic value cannot be set for flip-flops that were not designed as scan flip-flops. With such an arrangement, the acquired logic values provide insufficient information with respect to a fault, leading to a problem of reduced fault coverage.

In order to solve the aforementioned problem, with the multiple capture method, as shown in FIG. 16, the capture operation is repeatedly performed multiple times for each test input pattern in a capture mode. That is to say, the logic value acquired by each flip-flop 5 shown in FIG. 5 is input to the combinational circuit portion 3 as an updated input test pattern. With such an arrangement, the values captured by the respective flip-flops 5 are sequentially set in an incremental manner. Finally, the logic values are set for all the flip-flops 5. Thus, such an arrangement allows a set test output pattern to be obtained according to the set test input pattern. As a result, such an arrangement allows the fault coverage to be maintained even for a partial scan design semiconductor integrated circuit.

Specific description will be made with reference to FIG. 17 regarding a procedure for detecting a fault using the fault detection system 101. The input of a seed is started (Step ST501), and the seed is expanded by the expanding circuit 135 (Step ST502). The shift mode is started (Step ST503), and the test input pattern is scanned in to the flip-flops 5 (Step ST504). Subsequently, the capture mode is started (Step ST505), and the capture operation is repeatedly performed a predetermined number of times (ST506). In this step, the values of the test input pattern are sequentially set in an incremental manner every time the capture operation is repeatedly performed. The shift mode is again started (Step ST507), and the logic values held by the flip-flops 5 are scanned out (Step ST508). Next, when there is any remaining seed that has not been input, the flow returns to Step ST501. Otherwise, the flow proceeds to the next step (Step ST509). The acquisition unit 117 acquires the compressed data (signature) that is scanned out (Step ST510). The comparison unit 129 compares the signature thus obtained with a signature predicted for when the combinational circuit portion 3 operates normally (Step ST511). The fault judgment unit 131 judges based on the comparison result whether or not the combinational circuit portion 3 has a fault (Step ST512).

CITATION LIST

Non-Patent Documents

Non-Patent Document 1
C. Lin, Y. Zorian and S. Bhawmik, "PSBIST: A partial-scan based built-in self-test scheme", Proc. IEEE International Test Conf., 1993, pp 507-516.

SUMMARY OF INVENTION

Technical Problem

With such a technique described in Non-patent document 1, as shown in Expression (1), the amount of test data to be stored in the test pattern holding unit 133 is proportional to the number of test input patterns. Furthermore, as shown in Expression (2), the number of test output patterns is the same as the number of test input patterns. Moreover, there is a positive correlation between the fault coverage and the number of test output patterns. Accordingly, if the number of test input patterns is reduced, this leads to a problem of reduced fault coverage. Thus, with conventional techniques, in order to maintain the fault coverage, the number of test input patterns cannot be reduced. This leads to a problem in that, with conventional techniques, the amount of test data cannot be reduced.

[Expression 1]

$$\text{Amount of test data} \propto \text{the number of test input patterns} \quad (1)$$

$$\text{The number of test output patterns} = \text{the number of test input patterns} \quad (2)$$

Accordingly, it is a purpose of the present invention to provide a fault detection system and the like having improved fault coverage with a reduced amount of test data for test input patterns to be stored.

Solution to Problem

A first aspect in accordance with the present invention provides a fault detection system configured to detect a fault in a logic circuit based on a plurality of output logic values output from the logic circuit after a test input pattern is input, wherein the plurality of output logic values are input to the logic circuit as an updated test input pattern, the fault detection system comprising a first acquisition unit configured to acquire a part of or otherwise all of the plurality of output logic values, a comparison unit configured to compare an output logic value acquired by the first acquisition unit with an output logic value expected when no fault is present in the logic circuit or otherwise an output logic value expected when a fault is present in the logic circuit, and a fault judgment unit configured to judge whether or not there is a specific fault in the logic circuit, based on a comparison result obtained by the comparison unit.

A second aspect in accordance with the present invention provides the fault detection system of the first aspect, wherein the plurality of output logic values are held by a holding unit comprising a plurality of individual holding units each configured to hold a single logic value, and wherein the first acquisition unit is configured to acquire a part of or otherwise all of the plurality of output logic values held by the holding unit, and wherein a part of or otherwise all of the output logic values respectively held by the plurality of individual holding units are acquired directly such that each output logic value is acquired from the corresponding individual holding unit without passing through the other individual holding units.

A third aspect in accordance with the present invention provides the fault detection system of the second aspect, wherein the first acquisition unit is configured to acquire a part of or otherwise all of the plurality of output logic values held by the holding unit in a period of time from a time point at which the holding unit holds the plurality of output logic values up to a time point at which the holding unit holds a plurality of updated output logic values output from the logic circuit after the updated test input pattern is input to the logic circuit.

A fourth aspect in accordance with the present invention provides the fault detection system of the third aspect, further comprising a control unit configured to control a period of time from a time point at which the holding unit holds the output logic values up to a time point at which the holding unit holds a plurality of updated output logic values output from the logic circuit after the updated test input pattern is input to the logic circuit.

A fifth aspect in accordance with the present invention provides the fault detection system of any one of the second through the fourth aspects, further comprising a calculation unit configured to calculate a fault detection contribution value for each output logic value held by the individual holding units, and a priority judgment unit configured to judge a priority for each individual holding unit based on the contribution value, wherein the first acquisition unit is configured to selectively acquire a predetermined number of output logic values selected based on their priority from among the output logic values held by the plurality of individual holding units.

A sixth aspect in accordance with the present invention provides the fault detection system of any one of the second through the fifth aspects, further comprising a second acquisition unit configured to acquire a part of or otherwise all of the plurality of output logic values respectively held by the plurality of individual holding units via a different individual holding unit, wherein the comparison unit is configured to compare the output logic value acquired by the second acquisition unit with an output logic value expected when no fault is present in the logic circuit or otherwise an output logic value expected when a specific fault is present in the logic circuit, and wherein the number of times the first acquisition unit acquires the output logic value is greater than the number of times the second acquisition unit acquires the output logic value.

A seventh aspect in accordance with the present invention provides the fault detection system of any one of the first through sixth aspects, further comprising a first compressing unit configured to compress data size of the output logic value, and a first storage unit configured to store the output logic value, wherein, in synchronization with an acquisition operation of the first acquisition unit, the first compressing unit is configured to compress the output logic value acquired by the first acquisition unit, and the first storage unit is configured to store the output logic value compressed by the first compressing unit.

An eighth aspect in accordance with the present invention provides an acquisition apparatus configured to acquire a part of or otherwise all of a plurality of output logic values output from a logic circuit after a test input pattern is input to the logic circuit, wherein the plurality of output logic values are held by a holding unit configured to hold logic values, and are input to the logic circuit as an updated test input pattern, and wherein the holding unit comprises a plurality of individual holding units each configured to hold a single logic value, and wherein a part of or otherwise all of the output logic values respectively held by the plurality of individual holding units are acquired directly such that each output logic value is acquired from the corresponding individual holding unit without passing through the other individual holding units.

A ninth aspect in accordance with the present invention provides an acquisition apparatus configured to acquire a part of or otherwise all of a plurality of output logic values output from a logic circuit after a test input pattern is input to the logic circuit, wherein the plurality of output logic values are held by a holding unit configured to hold logic values, and are input to the logic circuit as an updated test input pattern, and wherein the acquisition apparatus comprises a control unit configured to control a period of time from a time point at which the holding unit holds the output logic values up to a time point at which the holding unit holds a plurality of updated output logic values output from the logic circuit after the updated test input pattern is input to the logic circuit, and wherein the acquisition apparatus is configured to acquire a part of or otherwise all of the plurality of output logic values held by the holding unit.

A tenth aspect in accordance with the present invention provides a fault detection method for detecting a fault in a logic circuit based on a plurality of output logic values output from the logic circuit after a test input pattern is input to the logic circuit, the fault detection method comprising first inputting, in which an initial test input pattern is input to the logic circuit, holding, in which a holding unit comprising a plurality of individual holding units each configured to hold a single logic value holds the plurality of output logic values, second inputting, in which the plurality of output logic values held by the holding unit are input to the logic circuit as an updated test input pattern, first acquiring, in which a part of or otherwise all of the plurality of output logic values respectively held by the plurality of individual holding units are acquired directly such that each output logic value is acquired from the corresponding individual holding unit without passing through the other individual holding units, in a period of time from a time point at which the holding unit holds the plurality of output logic values up to a time point at which the holding unit holds a plurality of updated output logic values output from the logic circuit after the updated test input pattern is input to the logic circuit, second acquiring, in which a part of or otherwise all of the plurality of output logic values respectively held by the plurality of individual holding units are acquired via a different individual holding unit, comparing, in which the output logic values acquired in the first acquiring and the second acquiring are compared with output logic values expected when no fault is present in the logic circuit or otherwise an output logic value expected when a specific fault is present in the logic circuit, and judging whether or not there is a fault in the logic circuit based on a comparison result obtained in the comparing.

An eleventh aspect in accordance with the present invention provides the fault detection method of the tenth aspect, further comprising first compressing, in which the output logic value acquired in the first acquiring is compressed in synchronization with the first acquiring, and first storing, in which the output logic value compressed in the first compressing is stored, wherein the first compressing and the first storing are provided between the first acquiring and the second acquiring, and wherein a sequence from the holding up to the first storing is repeatedly performed a predetermined number of times.

A twelfth aspect in accordance with the present invention provides the fault detection method of the eleventh aspect, further comprising controlling in which a control unit controls a period of time from a time point at which the holding unit holds the output logic values up to a time point at which the holding unit holds a plurality of updated output logic values output from the logic circuit after the updated test input pattern is input to the logic circuit, wherein the controlling is provided between the first storing and the holding.

A thirteenth aspect in accordance with the present invention provides the fault detection method of the twelfth aspect, wherein, in the controlling, the control unit performs a control operation so as to reduce a period of time from a time point at which the holding unit holds the output logic values up to a time point at which the holding unit holds a plurality of updated output logic values output from the logic circuit after the updated test input pattern is input to the logic circuit.

A fourteenth aspect in accordance with the present invention provides a fault detection method for detecting a fault in a logic circuit based on a plurality of output logic values output from the logic circuit after a test input pattern is input to the logic circuit, the fault detection method comprising first inputting, in which an initial test input pattern is input to the logic circuit, holding, in which a holding unit holds the plurality of output logic values, second inputting, in which the plurality of output logic values held by the holding unit are input to the logic circuit as an updated test input pattern, acquiring, in which a part of or otherwise all of the plurality of output logic values are acquired, comparing, in which the output logic values acquired in the acquiring are compared with an output logic value expected when no fault is present in the logic circuit or otherwise an output logic value expected when a specific fault is present in the logic circuit, and judging whether or not there is a fault in the logic circuit based on a comparison result obtained in the comparing, wherein the holding and the second inputting are repeatedly performed a predetermined number of times, and wherein the fault detection method further comprises controlling, in which a control unit controls a period of time from a time point at which the holding unit holds the output logic values up to a time point at which the holding unit holds a plurality of updated output logic values output from the logic circuit after the updated test input pattern is input to the logic circuit, and wherein the controlling is provided between the second inputting and the holding.

A fifteenth aspect in accordance with the present invention provides the computer program configured to instruct a computer connected to the holding unit to execute the fault detection method of any one of the tenth through fourteenth aspects.

A sixteenth aspect in accordance with the present invention provides the non-transitory computer-readable medium storing a computer program of the fifteenth aspect, the program which is executable by a computer connected to the holding unit.

It should be noted that the fault detection system according to the present invention as defined in the respective claims may further comprise an initial pattern storage unit configured to store an initial test input pattern. The pattern to be stored in the initial pattern storage unit may be a seed pattern (seed) obtained by compressing the initial test input pattern. In this case, the fault detection system may comprise an expanding unit configured to expand such a seed pattern. Also, the fault detection system may comprise a second compressing unit configured to compress the output logic value acquired by the second acquisition unit. Also, the fault detection system may comprise a single compressing unit configured to function as both the first compressing unit and the second compressing unit.

Also, with the fault detection system according to the present invention as defined in the respective claims, the second acquisition unit may comprise a second storage unit configured to store an output logic value acquired by the second acquisition unit. Also, the fault detection system may comprise a single storage unit configured to function as both the first storage unit and the second storage unit.

Advantageous Effects of Invention

With each aspect according to the present invention, by employing the acquisition unit or the acquisition apparatus, such an arrangement allows multiple test output patterns to be acquired using a single initial test input pattern. This is why the test output pattern is input to the logic circuit as an updated test input pattern that differs from the initial test input pattern every time the capturing operation is performed. In this case, the amount of test data is represented by the following Expression (3), as with conventional techniques. However, the number of test output patterns is represented by the following Expression (4).

[Expression 2]

$$\text{Amount of test data} \propto \text{the number of test input patterns} \quad (3)$$

$$\text{The number of test output patterns} = \text{the number of test input patterns} \times \text{the number of times capturing is performed} \quad (4)$$

The amount of test data is directly proportional to the number of initial test input patterns regardless of the number of times capturing is performed. Thus, by increasing the number of times capturing is performed, such an arrangement allows the number of initial test input patterns to be reduced, thereby providing improved fault coverage with a reduced amount of test data of the test input patterns to be stored.

Referring to FIG. 18, specific description will be made regarding the fact that the invention according to the respective claims allows a fault to be detected even if the fault cannot be detected by means of conventional multiple capture methods. FIG. 18 is a time expansion model showing an example in a case of employing a conventional multiple capture method.

For ease of description, description will be made regarding an arrangement in which the capturing is performed twice so as to perform a multiple capture operation. FIG. 18 shows a time flow of the logic values immediately after the initial test input pattern is scanned in in the shift mode until the capture has been performed twice.

Here, description will be made directing attention to a NOR gate indicated by "A". If the NOR gate operates normally, the flip-flop $5_3$ holds the logic value "0". However, let us consider a case in which the flip-flop $5_3$ holds the logic value "1" after the capturing has been performed once for a fault in the NOR gate (such as a delay fault). With such a conventional multiple capture method, such an arrangement acquires only the output logic value captured the last time capturing is performed. That is to say, with such conventional multiple capturing methods, the logic value of the flip-flop $5_3$ is not acquired before the mode is switched to the shift mode after capturing has been performed a predetermined number of times (twice, in this case). Furthermore, after the capturing has been performed twice, the flip-flop $5_3$ holds the logic value "0" which is the same value as that in the normal operation. Therefore, such a conventional method is not capable of detecting such a fault that occurs in the NOR gate.

In contrast, with each aspect according to the present invention, the acquisition unit or the acquisition apparatus is configured to acquire a value held by the holding unit after the capturing is performed once. Thus, even if an arrangement using a conventional technique is not capable of detecting a fault using a given test input pattern, and is capable of detecting this fault only by using a different suitable test input pattern, such an arrangement according to each aspect of the present invention is capable of detecting such a fault using the same test input pattern as the aforementioned given test input pattern. Thus, such an arrangement allows the required storage capacity to be reduced.

Furthermore, with the second aspect of the present invention, the first acquisition unit acquires each output logic value directly from the corresponding individual holding unit. Thus, such an arrangement is capable of acquiring the output logic value with high speed, even if there are a large number of primary output lines and a large number of individual holding units. In addition, such an arrangement is capable of acquiring each output logic value without overwriting the logic values held by the other different individual holding units.

Furthermore, with the third aspect of the present invention, the first acquisition unit acquires the output logic values held by the holding unit in synchronization with the holding operation in which the holding unit holds the output logic values, that is, in a period from the time point at which the holding unit holds the output logic values up to the time point at which the holding unit holds multiple updated output logic values output from the logic circuit after the logic circuit receives an updated test input pattern. Thus, such an arrangement allows the first acquisition unit to acquire the values held by the holding unit in a sure manner without the value acquired and held by the holding unit being overwritten with the output logic value to be captured in the next step every time the capturing is performed.

Furthermore, with the fourth, ninth, twelfth, and fourteenth aspects of the present invention, by increasing the clock period, such an arrangement allows only a stuck-at fault to be detected. Moreover, by shortening the clock period, such an arrangement is capable of detecting faults including a delay fault. Thus, such an arrangement provides information that contributes to fault cause analysis, and information that contributes to debugging.

Furthermore, with the thirteenth aspect of the present invention, such an arrangement is capable of detecting a delay fault using a shortened clock period after a test input pattern is input multiple times to the logic circuit to be tested using a long clock period so as to suppress IR drop. It is known that, in the capturing cycle, by repeatedly performing an input operation twice or three times in which the output pattern output from the logic circuit to be tested is again input to the logic circuit to be tested, such an arrangement provides a test input pattern which involves only a small number of transitions. Thus, such an arrangement provides reduced power consumption and reduced noise in the capturing operation, thereby allowing a delay fault to be detected with high precision.

Furthermore, with the fifth aspect of the present invention, such an arrangement allows the first acquisition unit to acquire with high priority the values held by the holding units that are particularly effective for a predetermined purpose, e.g., for providing improved fault coverage. Thus, such an arrangement is capable of providing improved fault coverage with higher efficiency. That is to say, such an arrangement allows the amount of test data to be further reduced. In addition, such an arrangement allows the amount of output data to be reduced, as compared with an arrangement in which the respective values held by all the holding units are acquired in synchronization with the holding operation of the holding units. Moreover, such an arrangement allows the circuit size to be reduced.

Furthermore, a typical arrangement requires a large number of clock pulses in the scan shift operation for each test input pattern. For example, in order to set an updated value for each of all the scan flip-flops that form a given scan chain, the number of clock pulses to be supplied is several hundreds to several thousands, which is the same number as that of the scan flip-flops. Accordingly, as can be understood from Expression (5), the greater part of the time required for testing is used for the shift mode. Thus, with the multiple capture method, even if the capture mode requires several to several tens of clocks, the greater part of the test time is used for the shift mode.

[Expression 3]

$$\begin{aligned}\text{Test time} &= \text{scan-in time} + \text{capture time} + \text{scan-out time} \\ &\approx \text{time for shift mode} \propto \text{scan length} \times \\ &\quad (\text{number of patterns to be scanned in} + \\ &\quad \text{number of patterns to be scanned out})\end{aligned} \quad (3)$$

With conventional techniques, the number of test input patterns to be scanned in cannot be reduced, and accordingly, the test time cannot be reduced. In contrast, with the invention according to the respective claims, such an arrangement is capable of reducing the time required for the shift mode. In particular, by reducing the number of initial test input patterns to be scanned in, such an arrangement provides a reduced scan-in time. Thus, such an arrangement allows the test time to be reduced.

A conventional arrangement requires a large number of test input patterns in order to improve the fault coverage, leading to an increased test time, which can be said to be a disadvantage of such a conventional arrangement in comparison with the present invention. In the field test after shipping, the test time is limited to when the semiconductor integrated circuit is in a non-operating state. Thus, it is particularly important to reduce the test time.

Furthermore, with the sixth aspect of the present invention, in the capture mode, in synchronization with the holding operation of the holding unit, the first acquisition unit is configured to acquire the test output pattern with a higher frequency than that with which the second acquisition unit acquires the test output pattern in the shift mode. That is to say, such an arrangement allows the scan-out time to be reduced. Thus, such an arrangement allows the test time to be further reduced in a simple manner.

Furthermore, with the seventh or eleventh aspect of the present invention, the acquisition operation, compressing operation, and storage operation are performed in synchronization with the holding operation and the test operation. Accordingly, such an arrangement allows a great amount of data acquired in the multiple capture operation to be stored at a high rate in the same current multiple capture mode, as compared with an arrangement in which the output data is stored in the shift mode. This allows the number of patterns to be scanned out to be reduced, thereby allowing the test time to be reduced in a simpler manner. Moreover, such an arrangement allows the amount of output data to be reduced in a simpler manner.

BRIEF DESCRIPTION OF DRAWINGS

FIG. 9A is a diagram showing a test cycle in a case in which fault detection is performed for all the clocks in the capture mode while changing the clock period, and FIG. 9B is a diagram showing a test cycle in a case in which only delay fault detection is performed in the capture mode while changing the clock period;

FIG. 11 is a diagram showing the fault coverage lists of three groups respectively obtained by performing intermediate acquisition after the priority level is judged for each flip-flop using the three respective selecting methods;

FIG. 12 is a diagram showing a comparison of the times required for the flip-flop priority level judgment;

FIG. 18 is a time expansion model showing an example in a case of employing a conventional multiple capture method.

DESCRIPTION OF EMBODIMENTS

Description will be made regarding an embodiment of the present invention with reference to the drawings. It should be noted that the present invention is not restricted to the following embodiments.

Example 1

Figure 1:
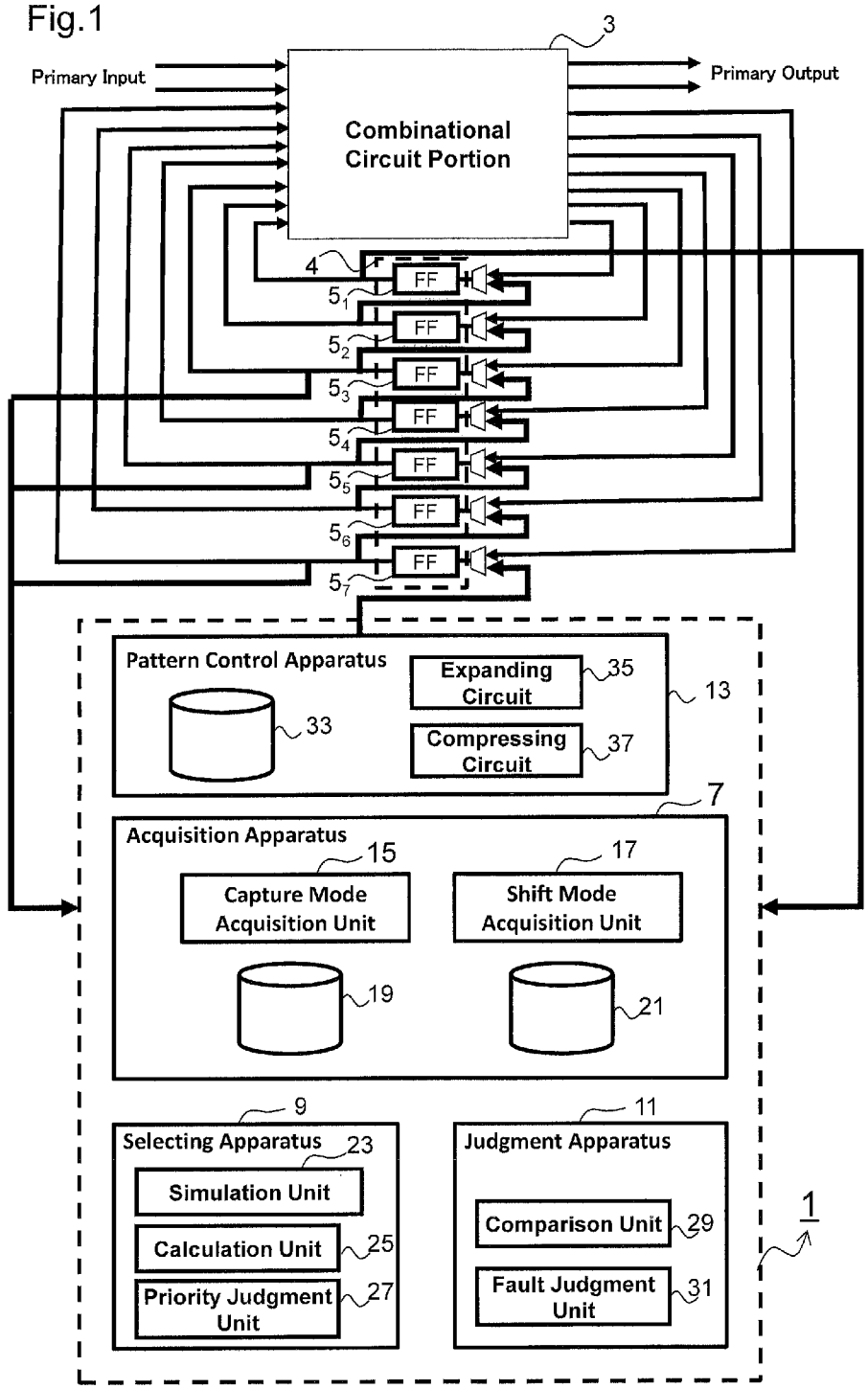
FIG. 1 is a block diagram showing an example of a fault detection system according to an embodiment of the present invention.

First, referring to FIG. 1, description will be made regarding a configuration of a fault detection system according to an embodiment of the present invention. FIG. 1 is a block diagram showing an example of a fault detection system according to the embodiment of the present invention.

A fault detection system 1 is configured to detect a fault in a combinational circuit portion 3 based on multiple output logic values output from the combinational circuit portion 3 (which corresponds to an example of a "logic circuit" in the claims). The combinational circuit portion 3 is connected to multiple flip-flops $5_1$ through $5_7$ (which each correspond to an example of an "individual holding unit" in the claims) configured to hold multiple output logic values. Each flip-flop 5 is configured to hold a single logic value. It should be noted that, unless necessary, a flip-flop is denoted by "flip-flop 5" without an index. Also, the multiple flip-flops 5 are collectively denoted by "holding unit 4" (which corresponds to an example of a "holding unit" in the claims). Furthermore, all the output lines of the combinational circuit portion 3 are assumed to be pseudo primary output lines. Moreover, the number of pseudo primary output lines (the number of output logic values) is assumed to be the same as the number of flip-flops 5. It should be noted that the number of pseudo primary output lines may be different from the number of flip-flops 5.

Figure 15:
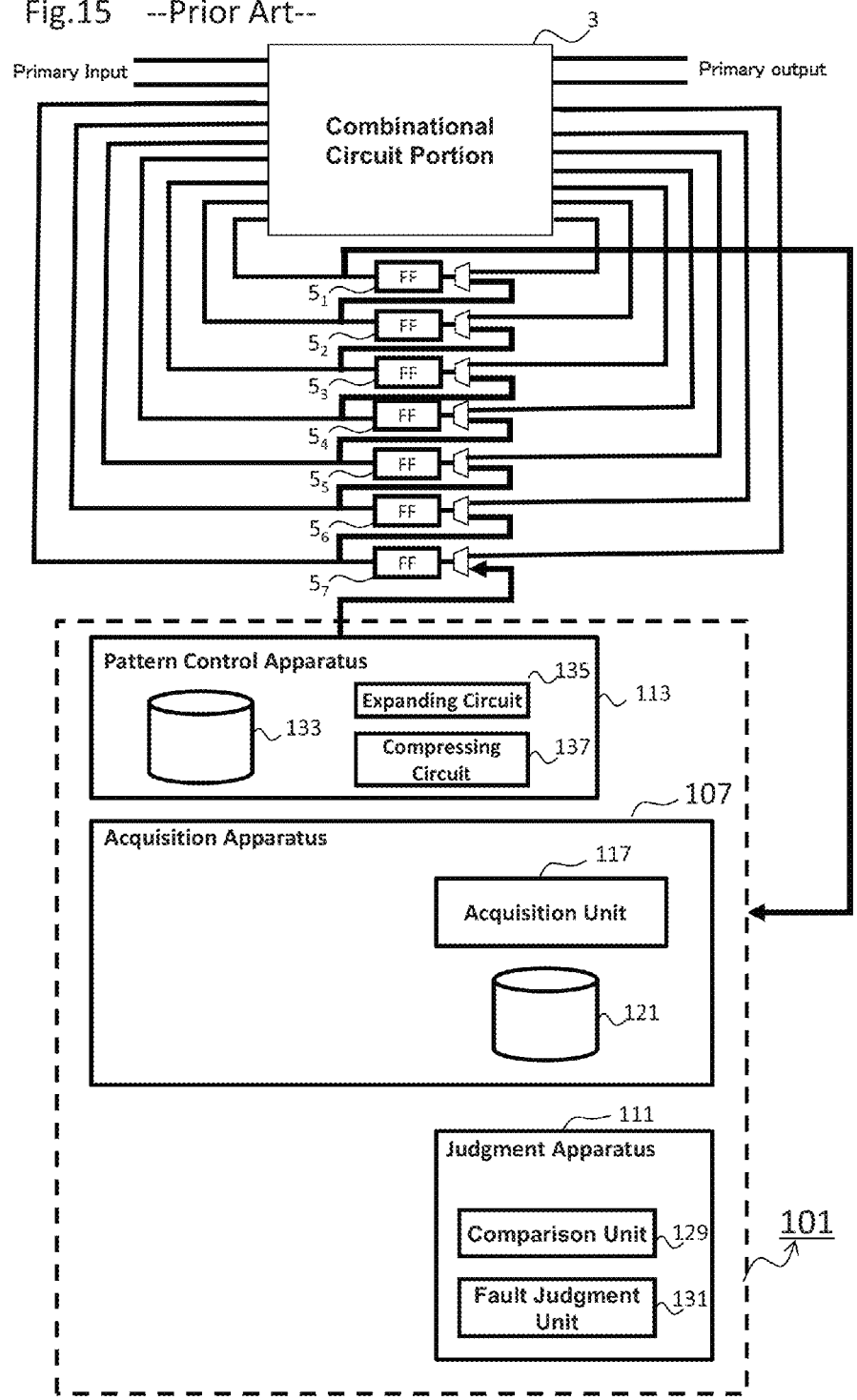
FIG. 15 is a block diagram showing a fault detection system using a background technique of the present invention.
Figure 16:
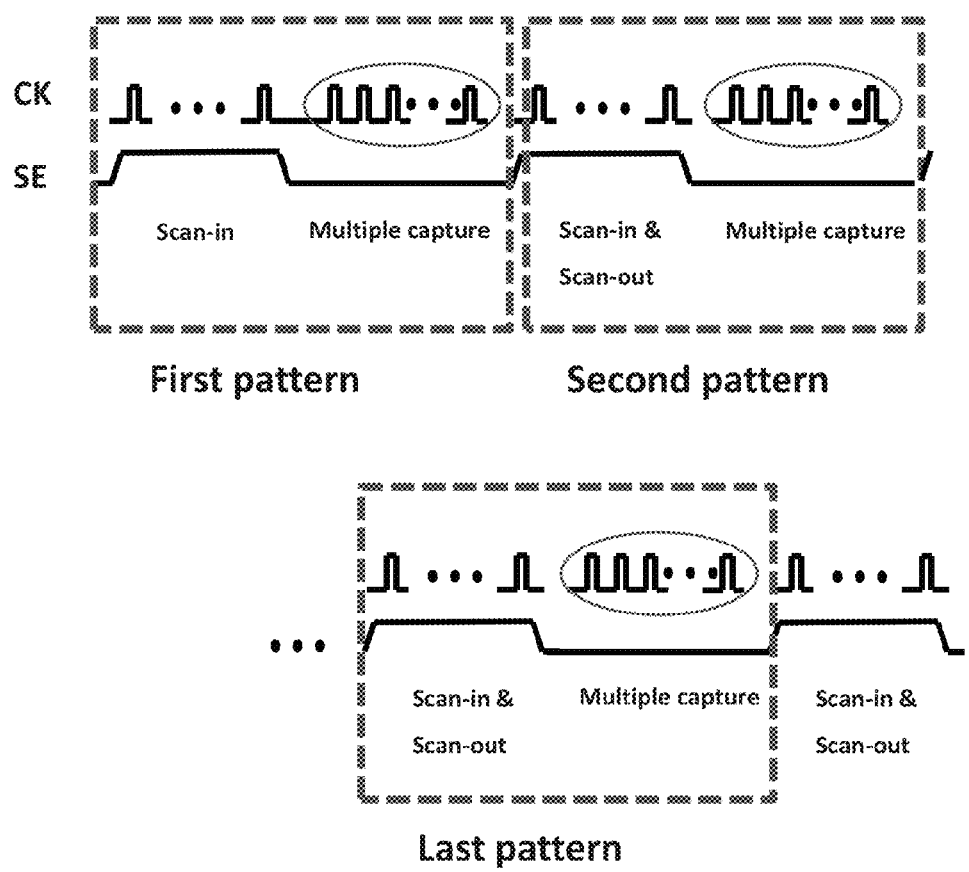
FIG. 16 is a diagram showing a test cycle using the multiple capture method.
Figure 17:
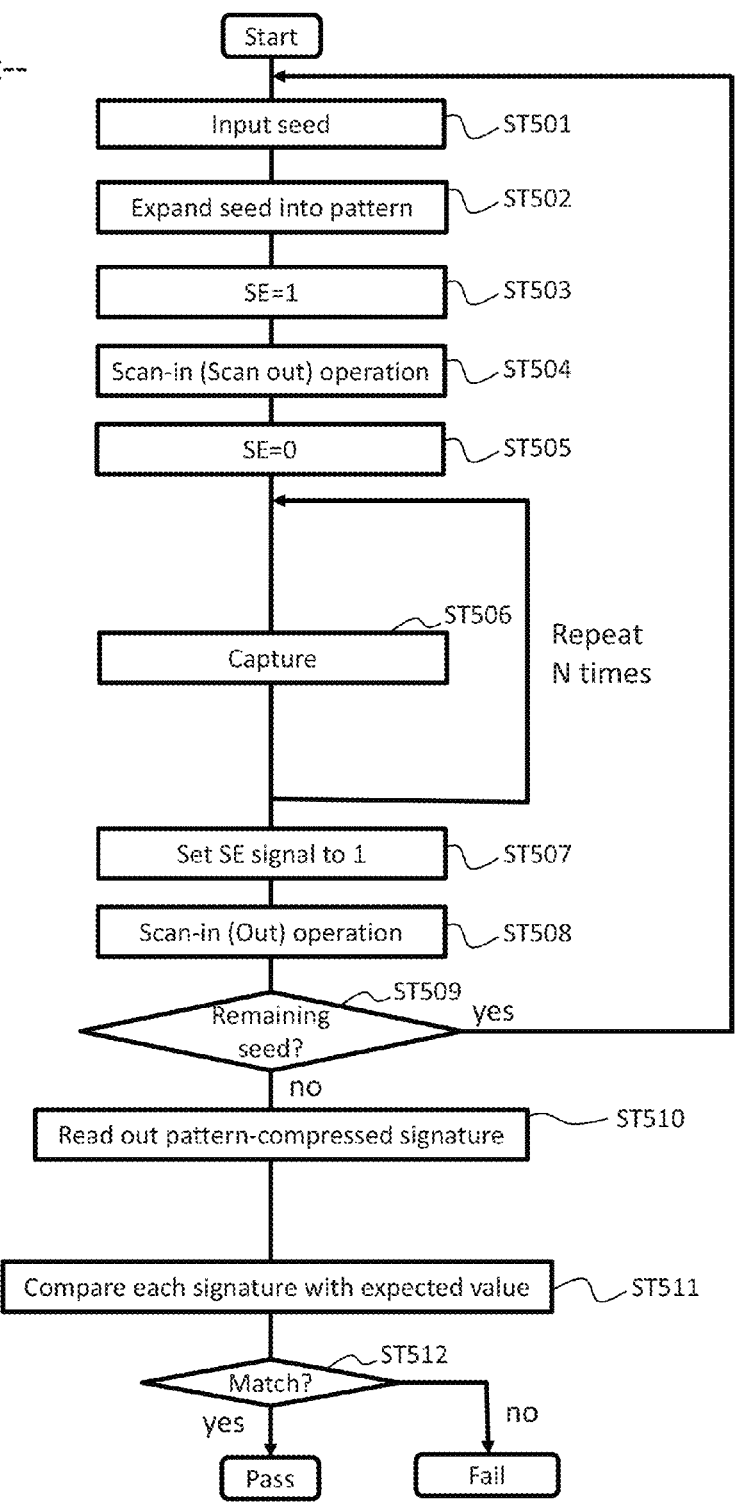
FIG. 17 is a flowchart showing a procedure in a case of employing a conventional multiple capture method.

The fault detection system 1 uses the multiple capture method in the same way as with the conventional fault detection system 101 shown in FIG. 15.

The fault detection system 1 includes an acquisition apparatus 7 (which corresponds to an example of an "acquisition unit" in the claims), a selecting apparatus 9, a judgment apparatus 11, and a pattern control apparatus 13. The acquisition apparatus 7 is configured to acquire a part of or otherwise all of the output logic values held by the flip-flops 5. The selecting apparatus 9 is configured to select the flip-flops that have values which are to be acquired by the acquisition apparatus 7 with high priority. The judgment apparatus 11 is configured to compare the output logic values thus acquired with predicted values so as to judge whether or not there is a fault in the combinational circuit portion 3. The pattern control apparatus 13 is configured to control the size and the like of the test input pattern to be input to the combinational circuit portion 3, and the test output pattern output from the combinational circuit portion 3.

The most characteristic feature of the fault detection system 1 is the acquisition apparatus 7. The acquisition apparatus 7 includes a capture mode acquisition unit 15 (which corresponds to an example of a "first acquisition unit" in the claims), a shift mode acquisition unit 17 (which corresponds to an example of a "second acquisition unit" in the claims), a capture mode storage unit 19 (which corresponds to an example of a "first storage unit" in the claims), and a shift mode storage unit 21 (which corresponds to an example of a "second storage unit" in the claims).

The capture mode acquisition unit 15 is configured to acquire a part of or all of the output logic values in synchronization with a capturing operation (which corresponds to an example of a "holding operation" in the claims) in which the flip-flops 5 capture multiple output logic values in the capture mode, and a test operation (which corresponds to an example of a "test operation" in the claims) performed by the combinational circuit portion 3 according to an updated test input pattern. Here, "acquisition in synchronization with the operation" means that the output logic values are acquired in a period from a time point at which the flip-flops 5 capture the output logic values up to a time point at which the flip-flops capture the next output logic values. Furthermore, the capture mode acquisition unit 15 is configured to directly acquire a part of or all of the output logic values held by the flip-flops $5_i$ ($1 \le i \le 7$) such that each output value is acquired directly from the corresponding flip-flop 5 without passing through the other different flip-flops $5_k$ ($1 \le k \le 7$, $k \ne i$). Moreover, the capture mode acquisition unit 15 instructs the capture mode storage unit 19 to store the output logic values thus acquired.

The shift mode acquisition unit 17 is configured to acquire the values scanned out from the flip-flops 5 in the shift mode. Furthermore, the shift mode acquisition unit 17 instructs the shift mode storage unit 21 to store the output logic values thus acquired. Here, the data acquisition operation of the shift mode acquisition unit 17 is performed after the test operations have all ended, for example. That is to say, the data acquisition operation of the shift mode acquisition unit 17 is not performed in synchronization with the capture operation and the test operation. Moreover, the shift mode acquisition unit 17 is configured to acquire a part of or all of the output logic values held by the flip-flops $5_i$ ($1 \le i \le 7$) such that each output value is acquired directly from the corresponding flip-flop $5_i$ via the other different flip-flops $5_k$ ($1 \le k \le 7$, $k \ne i$).

The selecting apparatus 9 includes a simulation unit 23, a calculation unit 25 (which corresponds to an example of a "calculation unit" in the claims), and a priority judgment unit 27 (which corresponds to an example of a "priority judgment unit" in the claims). The simulation unit 23 is configured to perform a fault simulation for the combination circuit unit 3. The calculation unit 25 is configured to calculate a fault detection contribution value for each flip-flop 5 based on the fault simulation result. The priority judgment unit 27 is configured to judge the priority for each flip-flop 5 based on the contribution value thus calculated. The judgment apparatus 11 includes a comparison unit 29 and a fault judgment unit 31. The comparison unit 29 is configured to compare the values that are acquired with the predicted values. Here, the predicted values may be configured as output logic values predicted for when the combinational circuit portion 3 has no faults. Otherwise, the predicted values may be configured as output logic values predicted for when the combinational circuit portion 3 has a predetermined fault. The fault judgment unit 31 is configured to judge based on the comparison result whether or not there is a fault in the combinational circuit portion 3. The pattern control apparatus 13 includes an initial test input pattern holding unit 33, an expanding circuit 35, and a compressing circuit 37. The initial test input pattern holding unit 33 is configured to hold a test pattern to be input to the combinational circuit portion 3. The initial test input pattern may be configured as a compressed seed pattern (seed). Description will be made in the present embodiment assuming that the pattern held by the initial test input pattern holding unit 33 is a seed.

Figure 2:
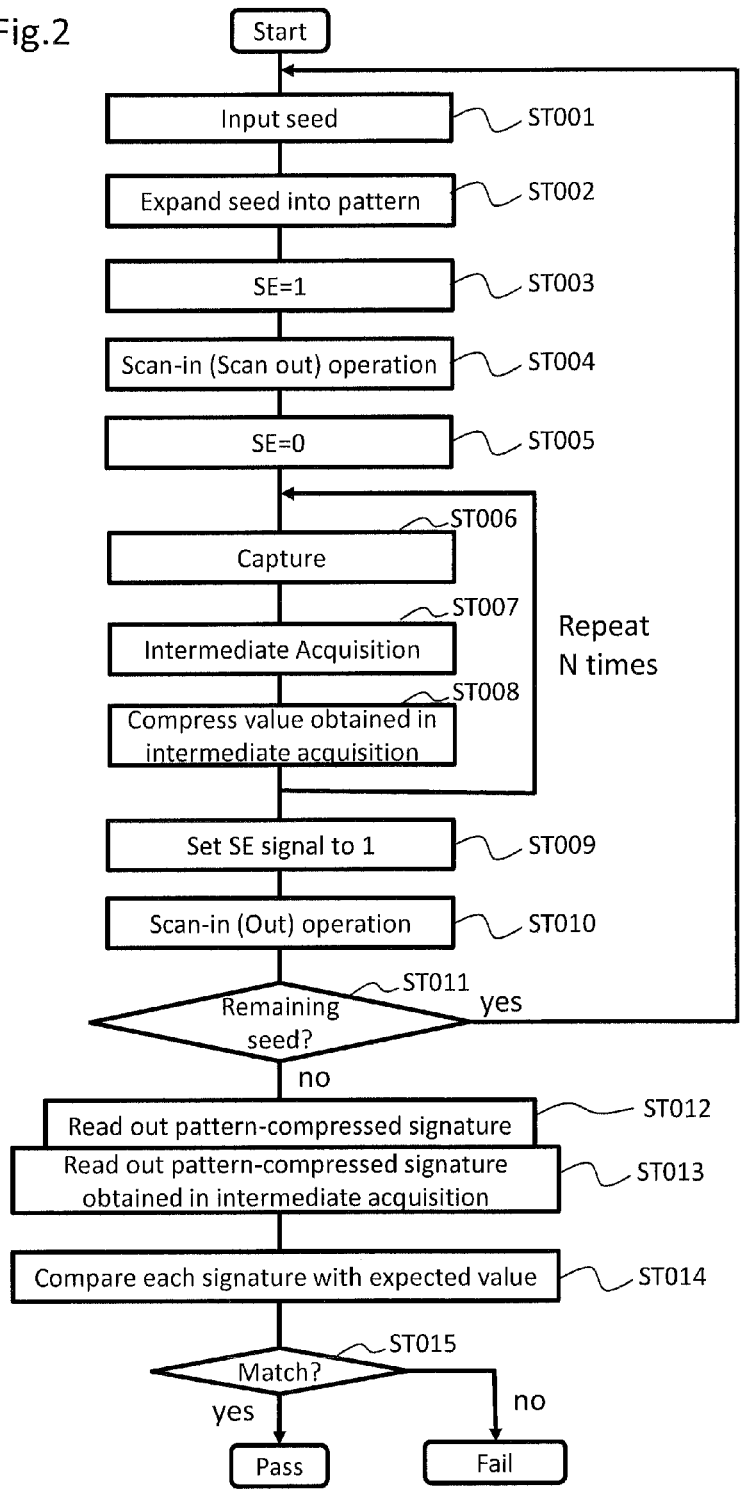
FIG. 2 is a flowchart showing an example of a procedure in a case of employing the fault detection system shown in FIG. 1.

Next, referring to FIG. 2, description will be made regarding a fault detection procedure using the fault detection system 1. FIG. 2 is a flowchart showing an example of a procedure in a case of employing the fault detection system 1.

In Step ST001, one seed is selected from among the seeds held by the initial test input pattern holding unit 33, and seed input to the combinational circuit portion 3 is started. In Step ST002, the seed thus selected is expanded by the expanding circuit 35. In Step ST003, the scan enable signal is set to 1, whereby the mode is switched to the shift mode. In Step ST004, the initial test input pattern thus expanded is scanned in to the flip-flops 5 in synchronization with the clock signal.

In Step ST005, the scan enable signal is set to 0, whereby the mode is switched to the capture mode. In Step ST006, the flip-flops 5 capture the output logic values output from the combinational circuit portion 3 in synchronization with the clock signal. In Step ST007, the capture mode acquisition unit 15 acquires the values held by the flip-flops 5 in synchronization with the capturing operation of the flip-flops 5. Furthermore, the flip-flops supply the respective values thus held to the combinational circuit portion 3 as the updated test input pattern. Moreover, the combinational circuit portion 3 performs the test operation according to the updated test input pattern thus received.

Here, the capture mode acquisition unit 15 performs "intermediate acquisition" in which the output logic values are acquired in an intermediate step in the capture mode. With conventional techniques, the output logic values are acquired only in the shift mode after the capture mode. That is to say, with conventional techniques, the logic values are not acquired in the capture mode. By providing such intermediate acquisition, such an arrangement allows the fault coverage to be improved with a reduced amount of test data, i.e., with a reduced number of initial test patterns.

Furthermore, the capture mode acquisition unit 15 is configured to acquire the logic values from only the flip-flops selected by the selecting apparatus 9 ($5_3$, $5_5$, and $5_7$ in the present embodiment). Thus, such an arrangement provides improved fault coverage per unit of test time. Description will be made later regarding a procedure for selecting the flip-flops.

In Step ST008, the values acquired by the capture mode acquisition unit 15 are compressed by the compressing circuit 37 into data having a reduced data size, and the capture mode storage unit 19 stores the data thus compressed. The operation from Step ST006 to Step ST008 is repeatedly performed a predetermined number of times (N times), following which the flow proceeds to the next step.

In Step ST009, the scan enable signal is set to 1, whereby the mode is switched to the shift mode. In Step ST010, the values held by the flip-flops 5 are scanned out to the shift mode acquisition unit 17 in synchronization with the clock signal. Furthermore, the values thus scanned out are compressed by the compressing circuit 37, and the values thus compressed are stored in the shift mode storage unit 21.

Here, the data acquisition by means of the shift mode acquisition unit 17 is performed in the shift mode. Accordingly, the data acquisition by means of the shift mode acquisition unit 17 is not performed in synchronization with either the capturing operation or the test operation. Such an acquisition operation in the shift mode requires a long period of time. Thus, the number of times the acquisition operation by means of the capture mode acquisition unit 15 is performed is set to be at least the same as or greater than the number of times the acquisition operation of the shift mode acquisition unit 17 is performed, thereby allowing the overall time required for the test to be reduced.

In Step ST011, the judgment apparatus 11 judges whether or not the initial test input pattern holding unit 33 holds a remaining seed that has not yet been input to the combinational circuit portion 3. When judgment is made that there is a seed that has not yet been input, the flow returns to Step ST001. Otherwise, the flow proceeds to the next step.

In Step ST012, the judgment apparatus 11 reads out the compressed data (signature) stored in the capture mode storage unit 19. Furthermore, in Step ST013, the judgment apparatus 11 reads out the signature stored in the shift mode storage unit 21. In Step ST014, the comparison unit 29 compares the values thus read out with the values predicted for when the combinational circuit portion 3 operates normally, or otherwise the values predicted for when the combinational circuit portion 3 has a predetermined fault. In Step ST015, the fault judgment unit 31 judges, based on the comparison result obtained by the comparison unit 29, whether or not there is a fault in the combinational circuit portion 3.

Figure 3:
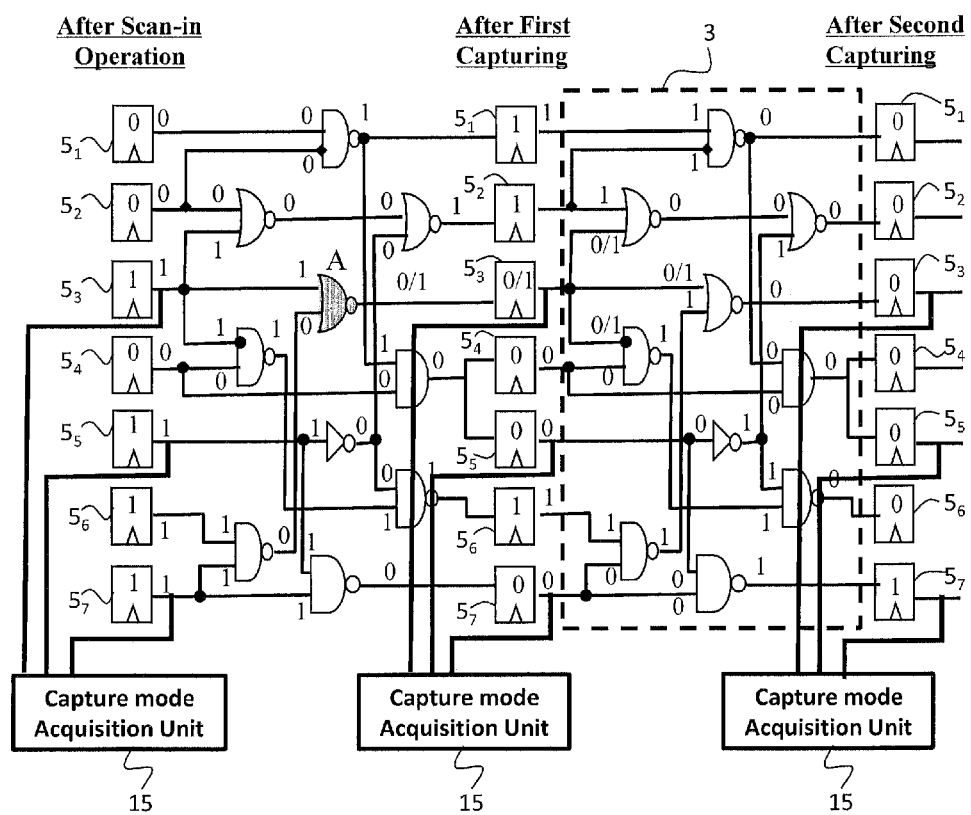
FIG. 3 is a time expansion model showing an example in a case of employing the fault detection system shown in FIG. 1.

Next, description will be made with reference to FIG. 3 regarding a specific example of fault detection in a case of employing the fault detection system 1. FIG. 3 is a time expansion model showing an example in a case of employing the fault detection system 1.

By employing the fault detection system 1, such an arrangement is capable of detecting a fault in a NOR element A, which is a defective element, denoted by "A" shown in FIG. 3. This is why the output logic value of the flip-flop $5_3$ is acquired by the capture mode acquisition unit 15 after the first capturing operation is performed. In a case in which the NOR element operates normally, the output logic value held by the flip-flop $5_3$ and acquired after the first capturing operation is 0. On the other hand, in a case in which the NOR element has a fault, the logic value thus acquired is 1.

Furthermore, in the shift mode, the shift mode acquisition unit 17 is configured to acquire all the logic values of the respective flip-flops 5. Thus, the number of output logic values thus acquired is at least equal to or otherwise greater than the number of output logic values acquired in a case of employing a conventional fault detection system. As a result, the fault detection system 1 provides fault coverage that is improved by the number of test output patterns acquired by the capture mode acquisition unit 15.

Figure 4:
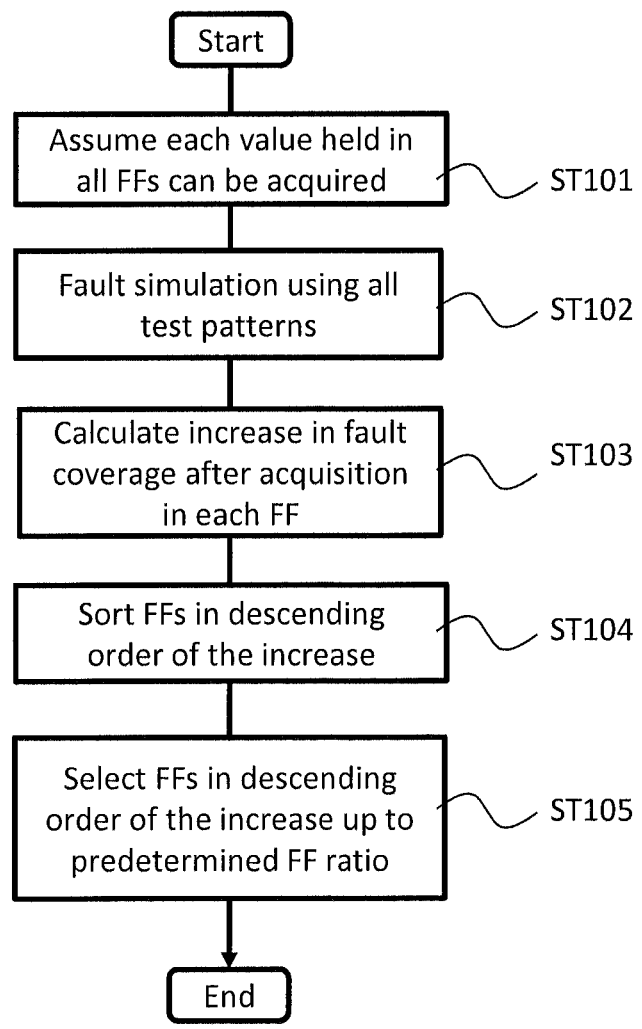
FIG. 4 is a flowchart showing an example of a procedure of a selecting operation by a selecting apparatus 9 for selecting flip-flops 5.

Next, referring to FIG. 4, description will be made regarding a procedure for selecting the flip-flops 5 which provide high-efficiency fault detection, i.e., improved fault coverage. FIG. 4 is a flowchart showing an example of a procedure of a selecting operation by the selecting apparatus 9 for selecting such flip-flops 5.

In Step ST101, all the flip-flops 5 are assumed to be configured such that the value held by each flip-flop 5 can be acquired. In Step ST102, the simulation unit 23 performs a fault simulation using all the test input patterns.

In Step ST103, the calculation unit 25 calculates, for each flip-flop 5, the increase in the fault coverage (which corresponds to an example of a "contribution value" in the claims) obtained by acquiring the value of the flip-flop 5. In Step ST104, the priority judgment unit 27 assigns a priority level to each flip-flop 5 in descending order of the increase in the fault coverage obtained by acquiring the flip-flop 5. In Step ST105, the selecting apparatus 9 selects the flip-flops 5 particularly contribute to improvement of the fault detection, based on the priority levels assigned to the respective flip-flops. With such an arrangement, in order to reduce the test time or the like, the capture mode acquisition unit 15 may acquire the respective values of only the flip-flops 5 which have been assigned a predetermined priority level or higher.

Subsequently, the capture mode acquisition unit 15 is connected to the flip-flops 5 thus selected. Here, a "connection" may be made using a desired method, as long as an electrical connection is made. Examples of such a connection include: a method in which a switch is switched from off to on; and a method in which a physical connection is made.

Such an arrangement allows the capture mode acquisition unit 15 to acquire only the respective values of the flip-flops 5 which provide high-efficiency fault detection. Furthermore, such an arrangement provides high-efficiency fault detection, thereby allowing the amount of test data to be further reduced.

Figure 5:
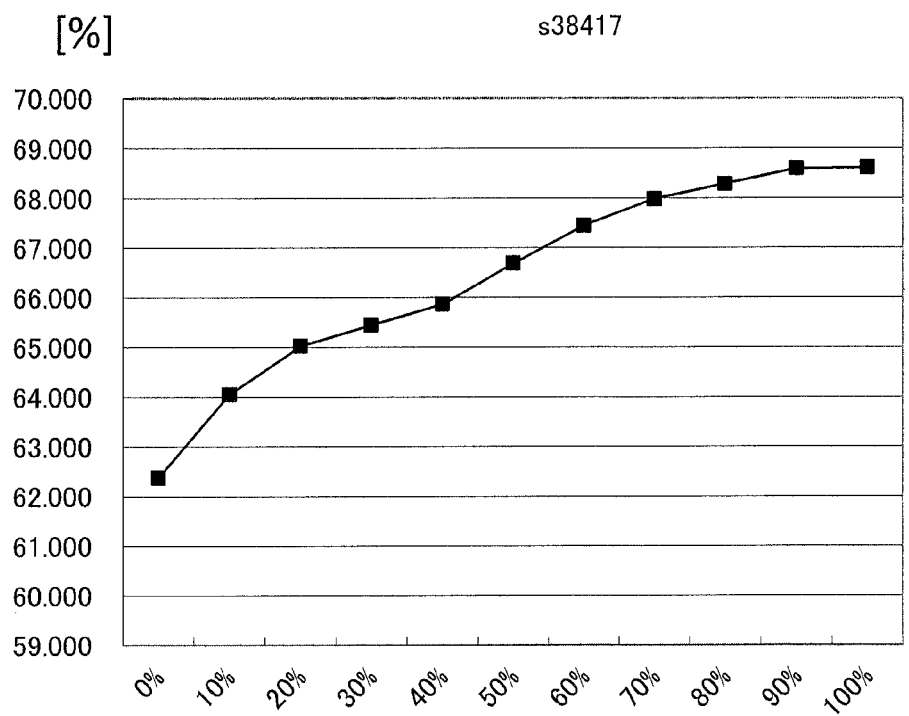
FIG. 5 is a graph showing an example of experimental results in a case of employing the fault detection system shown in FIG. 1.

Next, referring to FIG. 5, description will be made regarding experimental results in a case of employing the fault detection system 1. FIG. 5 shows an example of experimental results in a case of employing the fault detection system 1. The horizontal axis represents the percentage of flip-flops 5 selected as the flip-flops holding the values to be acquired by the capture mode acquisition unit 15. The longitudinal axis represents the fault coverage.

In FIG. 5, "0%" represents a case in which the capture mode acquisition unit 15 is not connected to any one of the flip-flops 5. "100%" represents a case in which the capture mode acquisition unit 15 is connected to all the flip-flops 5. In this experiment, there were 38,417 gates, and the multiple capture operation was repeatedly performed five times.

As can be understood from the experimental results shown in FIG. 5, as the percentage of flip-flops 5 connected to the capture mode acquisition unit 15 becomes greater, the fault coverage becomes higher. Furthermore, the rate of increase (the slope of the graph) of the fault coverage exhibits a maximum value in a range that corresponds to a case in which the number of flip-flops 5 thus selected is small. In a range of a certain percentage or more, saturation occurs in the rate of increase of the fault coverage. Thus, it can also be understood that such an arrangement is able to select the flip-flops 5 suitable for providing improved fault coverage. When almost 100% of the flip-flops 5 are connected to the capture mode acquisition unit 15, the fault coverage improves by approximately 6%. The increase in the fault coverage can be obtained by increasing the number of times capturing is performed, as can be understood from Expression (3).

Figure 6:
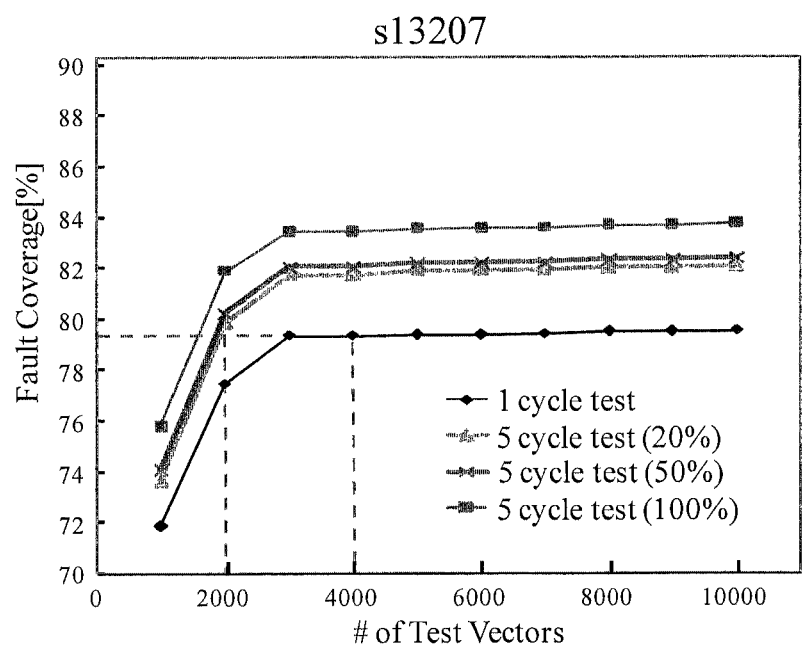
FIG. 6 is a graph which shows the relation between the number of test vectors and the fault coverage.

Next, description will be made with reference to FIG. 6 regarding the fact that, by providing the intermediate acquisition, such an arrangement allows the number of test vectors to be reduced. FIG. 6 is a graph which shows the relation between the number of test vectors and the fault coverage. The horizontal axis represents the number of test vectors, and the vertical axis represents the fault coverage. FIG. 6 shows a case in which the intermediate acquisition is not performed, a case in which the capturing operation is performed five times for 20% of the flip-flops 5 so as to perform the intermediate acquisition, a case in which the capturing operation is performed five times for 50% of the flip-flops 5 so as to perform the intermediate acquisition, and a case in which the capturing operation is performed five times for 100% of the flip-flops 5 so as to perform the intermediate acquisition.

As can be understood from FIG. 6, with the same number of test vectors, an arrangement using the intermediate acquisition provides improved fault coverage. Furthermore, FIG. 6 shows that, as the number of flip-flops used for the intermediate acquisition becomes greater, the fault coverage becomes higher. In addition, FIG. 6 shows that, even if only 20% of the flip-flops 5 are used for the intermediate acquisition, such an arrangement provides the effect of improving the fault coverage.

In a case of employing a conventional fault detection method, in order to improve the fault coverage from 95% to 98%, such a conventional arrangement requires approximately double the test input patterns. The fault detection method according to the embodiment of the present invention can be employed in addition to conventional methods. Thus, such an arrangement according to the present invention allows the fault coverage obtained using such a conventional method to be further improved with a reduced amount of test data for the test input patterns.

Figure 7:
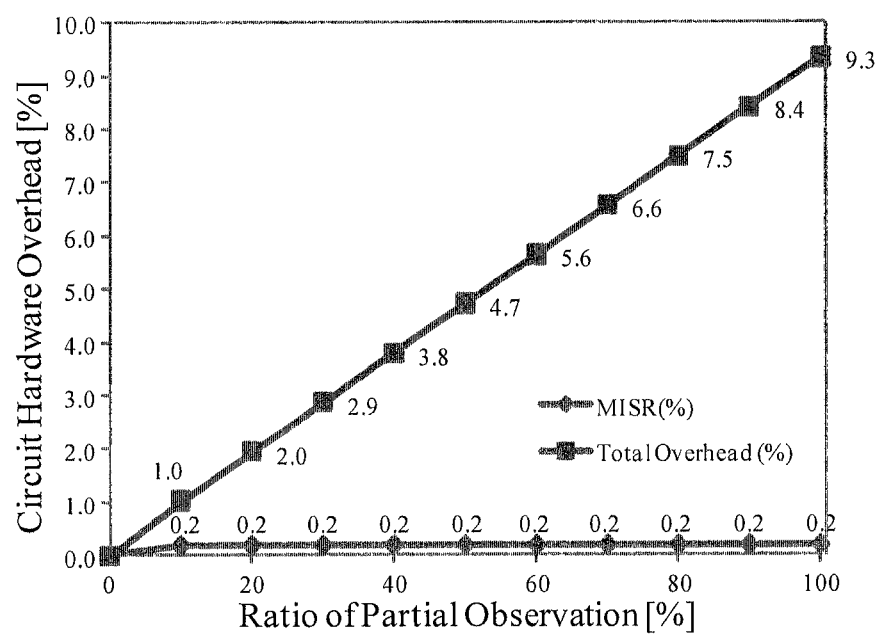
FIG. 7 is a diagram showing the relation between the percentage of the flip-flops from which logic values are to be directly acquired and the circuit overhead.

Furthermore, description will be made with reference to FIG. 7 regarding the fact that, by acquiring the respective values of a part of the flip-flops, such an arrangement is capable of reducing hardware overhead. FIG. 7 is a diagram showing the relation between the percentage of the flip-flops having logic values to be acquired and the circuit overhead. The horizontal axis represents the percentage of the flip-flops 5 having logic values to be acquired. The vertical axis represents the percentage of circuit overhead.

As can be understood from FIG. 7, the increase in the circuit overhead is approximately proportional to the percentage of the flip-flops 5 used for the intermediate acquisition. For example, when the intermediate acquisition is performed for 100% of the flip-flops, the increase in the hardware overhead is 9.3%. In contrast, when the intermediate acquisition is performed for 20% of the flip-flops, the increase in the hardware overhead is only 2.0%. Thus, by performing the intermediate acquisition for only the appropriately selected flip-flops, such an arrangement is capable of providing improved fault coverage while suppressing an increase in the hardware overhead.

Example 2

Next, description will be made regarding processing in which the clock period is changed in the capture mode. By changing the clock period, such an arrangement is capable of detecting a different kind of fault. Furthermore, such an arrangement allows power consumption and noise to be reduced in this test. It should be noted that the clock period corresponds to a period of time from a time point at which the flip-flops 5 hold multiple output values received from the combinational circuit portion 3 up to a time point at which the flip-flops 5 hold multiple updated output logic values output from the combinational circuit portion 3 after the updated test input pattern is input.

Figure 8:
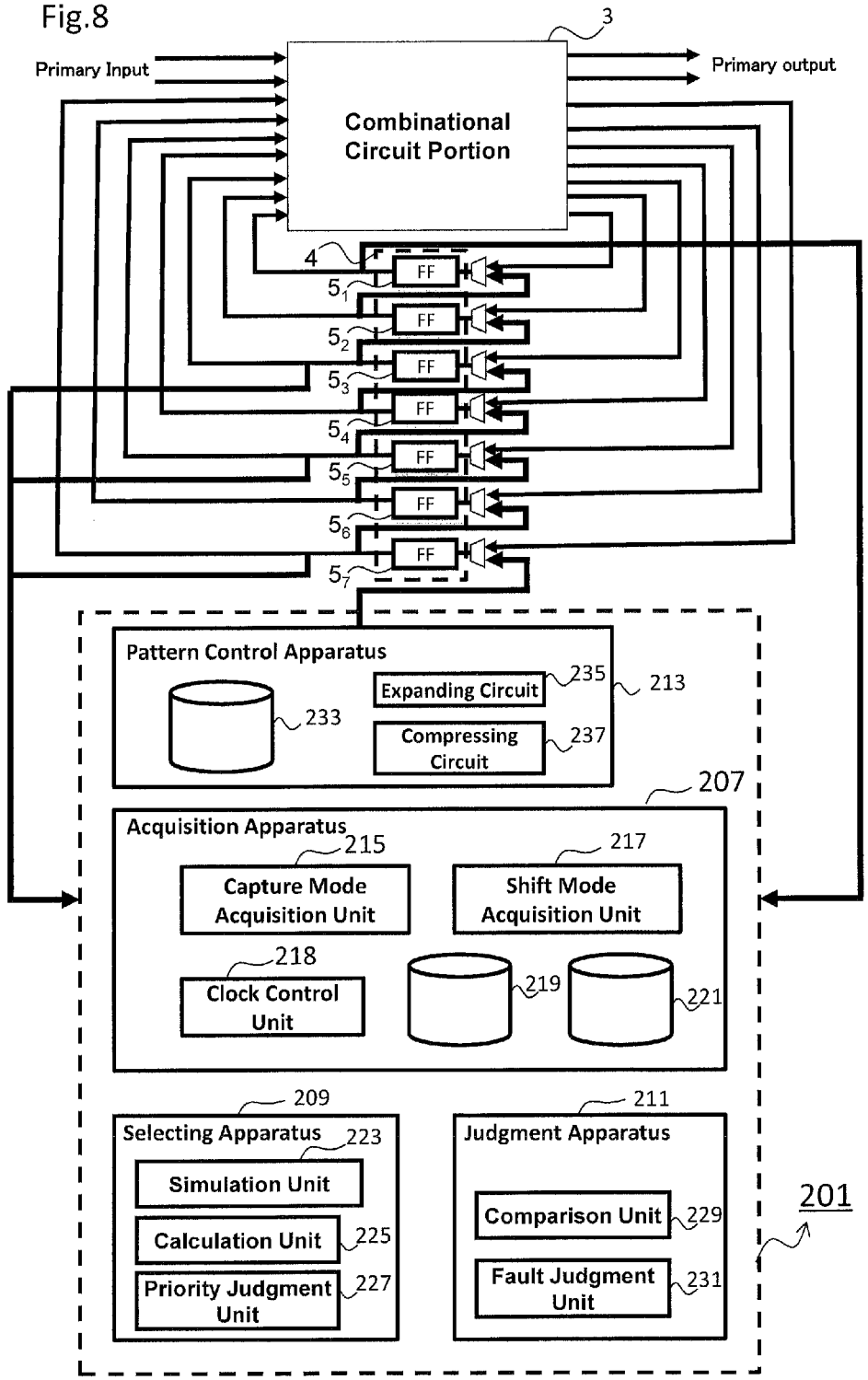
FIG. 8 is a block diagram showing an example of a fault detection system which is capable of changing the clock period.

FIG. 8 is a block diagram showing an example of a fault detection system which is capable of changing the clock period. FIG. 9 is a diagram showing a test cycle in a case in which the clock period is changed in the capture mode. FIG. 9A shows a case in which fault detection is performed for all the clocks. FIG. 9B shows a case in which only delay fault detection is performed. Referring to FIG. 8, as in FIG. 1, a fault detection system 201 includes an acquisition apparatus 207 (which corresponds to an example of an "acquisition unit" in the claims), a selecting apparatus 209, a judgment apparatus 211, and a pattern control apparatus 213. The acquisition apparatus 207 includes a capture mode acquisition unit 215 (which corresponds to an example of a "first acquisition unit" in the claims), a shift mode acquisition unit 217 (which corresponds to an example of a "second acquisition unit" in the claims), a clock control unit 218 (which corresponds to an example of a "control unit" in the claims), a capture mode storage unit 219 (which corresponds to an example of a "first storage unit" in the claims), and a shift mode storage unit 221 (which corresponds to an example of a "second storage unit" in the claims). The selecting apparatus 209 includes a simulation unit 223, a calculation unit 225 (which corresponds to an example of a "calculation unit" in the claims), and a priority judgment unit 227 (which corresponds to an example of a "priority judgment unit" in the claims). The judgment apparatus 211 includes a comparison unit 229 and a fault judgment unit 231. The pattern control apparatus 213 includes an initial test input pattern holding unit 233, an expanding circuit 235, and a compressing circuit 237.

A fault detection system 201 shown in FIG. 8 has the same configuration as that of the fault detection system 1 shown in FIG. 1 except that it includes the clock control unit 218. The clock control unit 218 controls the period in which the flip-flops 5 capture the output logic values from the combinational circuit portion 3, and the period in which the values held by the flip-flops 5 are supplied to the combinational circuit portion 3 as an updated test input pattern.

In the multiple capture operation, a test input pattern is input multiple times to the combinational circuit portion 3 to be tested. In this case, it is known that, in and after the third test input pattern input operation or so, the ratio of the elements included in the combinational circuit portion 3 that each have a logic value that transits according to the input of the test input pattern (toggle rate) is very small. In general, the toggle rate exhibits a smaller value in a scan test than that in an operation according to a random test input pattern, and exhibits an even smaller value in ordinary use by a user. Typically, it is said that the toggle rate exhibits a value on the order of 50% in an operation according to a random test input pattern, exhibits a value on the order of 20 to 30% in a scan test, and exhibits a value on the order of 5% in ordinary use by a user. It is thought that, by inputting a test input pattern multiple times to the combinational circuit portion 3, such an arrangement provides a situation that is close to ordinary use by a user, which contributes to a reduced toggle rate. The transition of the logical values leads to increased power consumption and increased noise. Thus, reduction in the toggle rate allows the fault detection to be performed with high precision.

Thus, for example, as shown in FIG. 9A, the clock period is set to a long period for the first group of four clocks, and only stuck-at fault detection is performed. The toggle rate can be thought to be large in the second and third clocks. Accordingly, if the clock period is reduced for the second or third clock, this leads to a large number of transitions and a sudden change in the voltage (IR drop). In some cases, this leads to a fault operation in the circuit, leading to a problem in that the flip-flops 5 capture fault output logic values. By setting the clock period of the first clock group to a long period, such an arrangement avoids such a risk of test-induced yield loss. In the fault detection operation in which the clock period is set to a long period, such an arrangement cannot detect a delay fault that depends upon the clock timing. However, in this operation, such an arrangement is capable of detecting a stuck-at fault that does not depend upon the clock timing.

In the subsequent three clocks, fault detection including delay fault detection is performed using a clock having a period reduced by the clock control unit 218. Before this fault detection, the test input pattern has already passed through the combinational circuit portion 3 four times. Accordingly, in this stage, the test input pattern provides a low toggle rate, and excessive change in the voltage is not likely to occur even if the clock period is reduced. Thus, such an arrangement allows the power consumption and noise involved in the delay fault detection to be reduced.

Also, as shown in FIG. 9B, such an arrangement may detect only a delay fault that can be detected in the subsequent group of three clocks. In order to provide such a function, for example, the capture mode acquisition unit 215 is controlled via a capture enable signal line (CE). As a specific example, an arrangement may be made in which, when the flip-flops 5 perform the capturing operation with a short clock period, CE is set to 0, so as to instruct the capture mode acquisition unit 215 to acquire the logic values held by the flip-flops 5. Also, an arrangement may be made in which, in a step other than when the flip-flops 5 perform the capturing operation with a short clock period, CE is set to 1, so as to disable the acquisition by the capture mode acquisition unit 215 of the logic values held by the flip-flops 5.

Example 3

Also, in the operation for judging the priority level of each flip-flop, a method known as SCOAP (Sandia Controllability Observability Analysis Program) analysis may be employed, instead of the simulation. Such an arrangement allows the amount of calculation required for the priority level judgment to be reduced.

Figure 10:
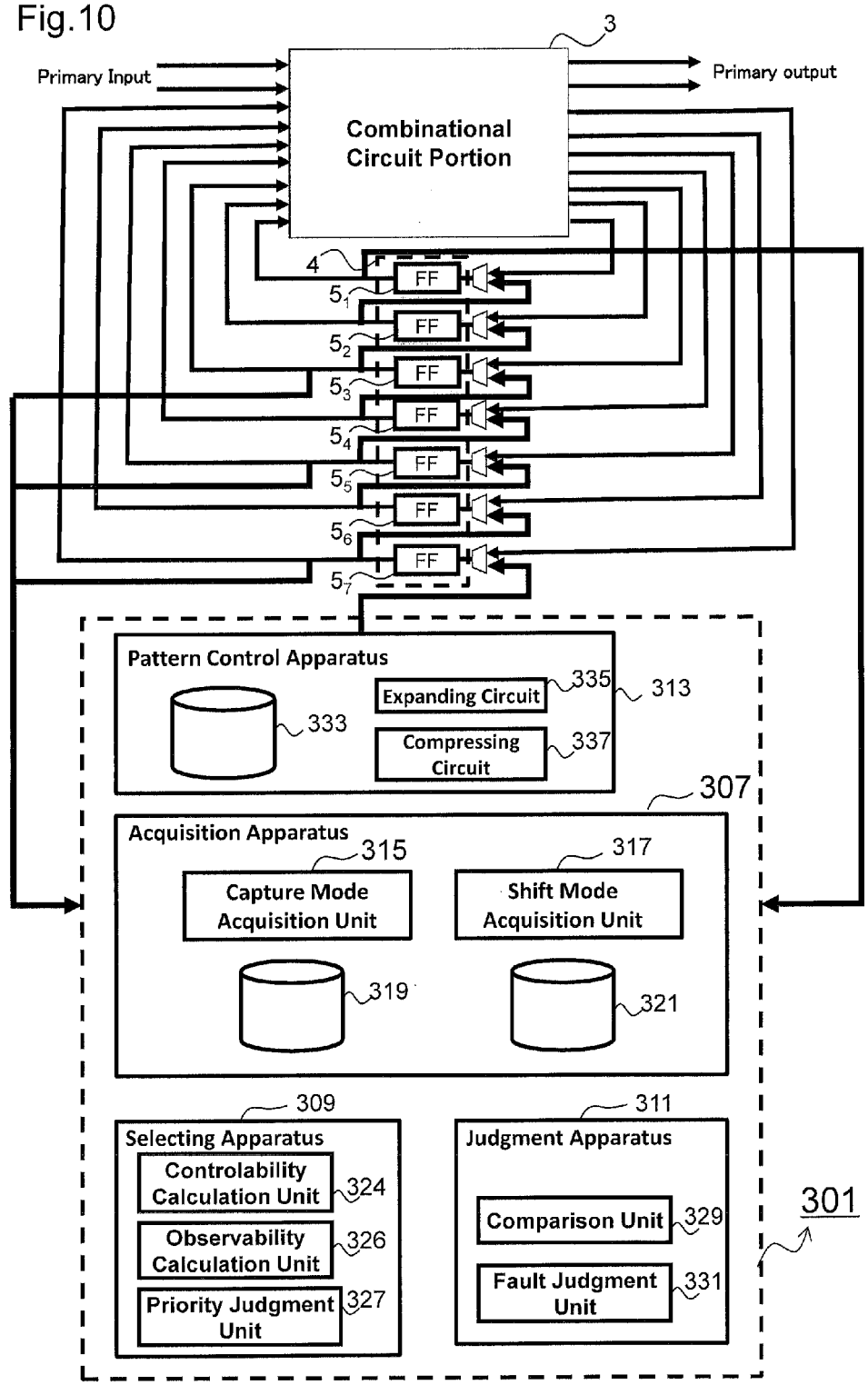
FIG. 10 is a block diagram showing an example of a fault detection system employing SCOAP analysis.

FIG. 10 is a block diagram showing an example of a fault detection system employing SCOAP analysis. Referring to FIG. 10, as in FIG. 1, a fault detection system 301 includes an acquisition apparatus 307 (which corresponds to an example of an "acquisition unit" in the claims), a selecting apparatus 309, a judgment apparatus 311, and a pattern control apparatus 313. The acquisition apparatus 307 includes a capture mode acquisition unit 315 (which corresponds to an example of a "first acquisition unit" in the claims), a shift mode acquisition unit 317 (which corresponds to an example of a "second acquisition unit" in the claims), a capture mode storage unit 319 (which corresponds to an example of a "first storage unit" in the claims), and a shift mode storage unit 321 (which corresponds to an example of a "second storage unit" in the claims). The selecting apparatus 309 includes a controllability calculation unit 324, an observability calculation unit 326 (which correspond to an example of a "calculation unit" in the claims), and a priority judgment unit 327 (which corresponds to an example of a "priority judgment unit" in the claims). The judgment apparatus 311 includes a comparison unit 329 and a fault judgment unit 331. The pattern control apparatus 313 includes an initial test input pattern holding unit 333, an expanding circuit 335, and a compressing circuit 337. The fault detection system 301 shown in FIG. 10 has the same configuration as that of the fault detection system 1 shown in FIG. 1 except that the fault detection system 301 includes the controllability calculation unit 324 and the observability calculation unit 326, instead of the simulation unit 23 and the calculation unit 25 shown in FIG. 1. The controllability calculation unit 324 calculates the controllability of each element included within the combinational circuit portion 3. The observability calculation unit 326 calculates the observability of each element included within the combinational circuit 3 and of each flip-flop 5. The priority judgment unit 327 judges the priority level for each flip-flop 5 in descending order of observability thus calculated. The comparison and fault judgment are performed in the same way as with the fault detection system 1 shown in FIG. 1.

Description will be made with reference to FIG. 11 regarding the effect of the SCOAP analysis in the priority level judgment. FIG. 11 is a diagram showing the fault coverage lists of three groups respectively obtained by performing intermediate acquisition after the priority level is judged for each flip-flop using the three respective selecting methods.

As shown in FIG. 11, the intermediate acquisition is performed for 20% of the flip-flops 5 for multiple circuits. As a result, it was confirmed that, for each circuit, the selection of the flip-flops 5 using the SCOAP analysis provides fault coverage that is higher than that provided by random selection of 20% of the flip-flops, though lower than that provided by flip-flop selection using the simulation.

FIG. 12 is a diagram showing a comparison of the times required for the flip-flop priority level judgment. As can be understood from FIG. 12, the selection of the flip-flops 5 using SCOAP analysis requires only a very short period of CPU time as compared with the flip-flop selection using simulation.

It should be noted that the scan-in operation and the scan-out operation may be performed at the same time in Step ST004. That is to say, an arrangement may be made in which, in Step ST004, at the same time as the time point at which the expanded initial test input pattern is scanned in to the flip-flops 5 in synchronization with the clock signal, the values held by the flip-flops 5 are scanned out to the shift mode acquisition unit 17. By performing the scan-in operation and the scan-out operation at the same time, such an arrangement is capable of reducing the time required for the shift mode. The same can be said of Step ST010.

Also, in Step ST008 in the flow shown in FIG. 2, the order of the storage operation of the capture mode storage unit 19 and the compressing operation of the compressing circuit 37 is not restricted in particular. Also, the capture mode acquisition unit 15 may acquire the output signal compressed by the compressing circuit 37. The same can be said of the order of the operations of the shift mode acquisition unit 17, the shift mode storage unit 21, and the compressing circuit 37.

Also, the readout operation in Step ST012 may be executed together with the operation in Step ST004 included in a loop operation which is an operation that is subsequent to Step ST011. Also, although it involves a risk of a long test time, the operation in Step ST012 may be included within the loop operation from Step ST006 up to Step ST008. The same can be said of each of Steps ST013 through ST015 as Step ST012.

Figure 13:
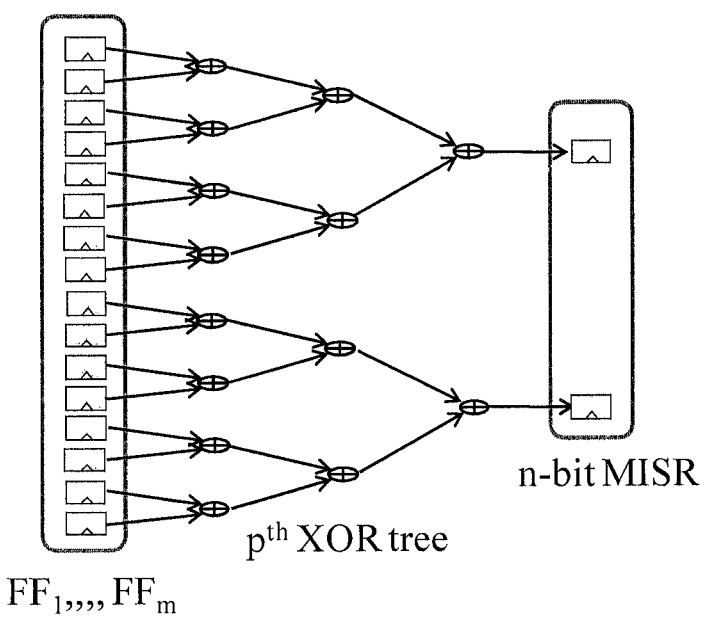
FIG. 13 is a diagram showing an example of a compressing circuit.
Figure 14:
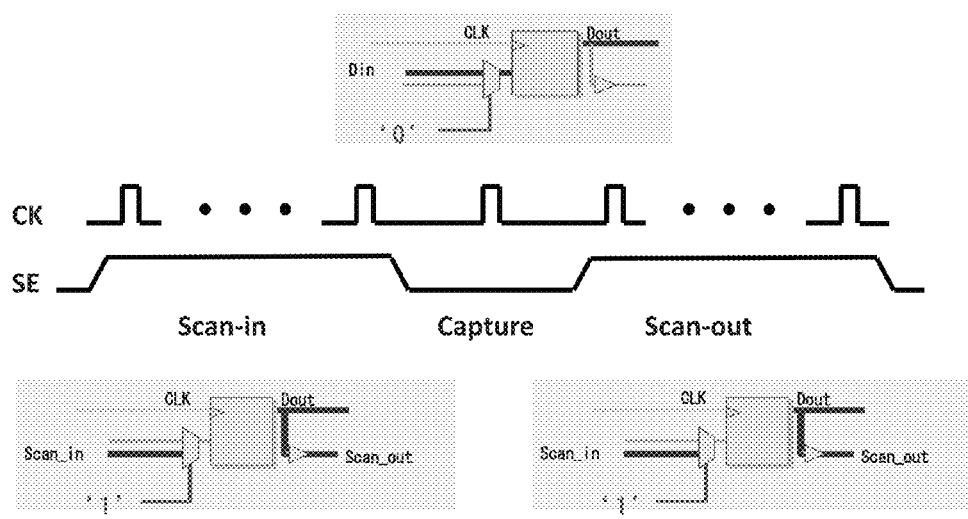
FIG. 14 is a diagram showing a test cycle of a scan test.

Also, the initial test input pattern holding unit 33 may include a test pattern generator such as a linear feedback shift register (LFSR), for example. In this case, an arrangement may be made in which the LFSR successively generates an update seed based on the seed held by the initial test input pattern holding unit 33, the updated seed is expanded, and the updated seed thus expanded is used as an initial test input pattern. Also, the compressing circuit 37 may be configured as a multi-input signature register (MISR) configured to convert the output logic value received via N scan chains into an N-bit signature. By employing such a MISR shown as an example in FIG. 13, such an arrangement requires only a 0.2% increase in circuit overhead as shown in FIG. 7 even if there is an increase in the number of flip-flops the values of which are to be acquired. It should be noted that the compressing circuit may be included within the acquisition apparatus.

By employing the configuration according to the aforementioned embodiment, such an arrangement provides fault detection assuming that the scan circuit has a conventional configuration. Also, the output of the test output pattern received from the logic circuit to be tested may be divided into two separate lines. In this case, such an arrangement allows a test output pattern to be output to the acquisition apparatus in synchronization with an input operation in which an output signal from one of the two separate lines is input as an updated test input pattern to the logic circuit to be tested. Thus, such an arrangement does not require the holding unit.

Also, a part of or the whole of the fault detection system 1 may be built into the semiconductor logic circuit including the combinational circuit portion 3 and the flip-flops 5. Also, a part of or the whole of the fault detection system 1 may be configured as a tester. Also, a part of the fault detection system 1 may be built into the semiconductor logic circuit, and the other part may be configured as a tester.

REFERENCE SIGNS LIST 1 fault detection system, 3 combinational circuit portion, 5 flip-flop, 7 acquisition apparatus, 9 selecting apparatus, 15 capture mode acquisition unit, 19 capture mode storage unit, 23 simulation unit, 25 calculation unit, 27 priority judgment unit, 218 clock control unit, 324 controllability calculation unit, 326 observability calculation unit 326.

The invention claimed is:

1. A fault detection system configured to detect a fault in a logic circuit based on a plurality of output logic values output from the logic circuit after a test input pattern is input,
wherein the plurality of output logic values are input to the logic circuit as an updated test input pattern,
the fault detection system comprising:
a first acquisition unit configured to acquire a part of or otherwise all of the plurality of output logic values;
a comparison unit configured to compare an output logic value acquired by the first acquisition unit with an output logic value expected when no fault is present in the logic circuit or otherwise an output logic value expected when a fault is present in the logic circuit; and
a fault judgment unit configured to judge whether or not there is a specific fault in the logic circuit, based on a comparison result obtained by the comparison unit,
wherein the plurality of output logic values are held by a holding unit comprising a plurality of individual holding units each configured to hold a single logic value,
and wherein the first acquisition unit is configured to acquire a part of or otherwise all of the plurality of output logic values held by the holding unit,
and wherein a part of or otherwise all of the output logic values respectively held by the plurality of individual holding units are acquired directly such that each output logic value is acquired from the corresponding individual holding unit without passing through the other individual holding units,
the fault detection system further comprising a second acquisition unit configured to acquire a part of or otherwise all of the plurality of output logic values respectively held by the plurality of individual holding units via a different individual holding unit,
wherein the comparison unit is configured to compare the output logic value acquired by the second acquisition unit with an output logic value expected when no fault is present in the logic circuit or otherwise an output logic value expected when a specific fault is present in the logic circuit, and
wherein a number of times the first acquisition unit acquires the output logic value is greater than a number of times the second acquisition unit acquires the output logic value.

2. The fault detection system according to claim 1, wherein the first acquisition unit is configured to acquire a part of or otherwise all of the plurality of output logic values held by the holding unit in a period of time from a time point at which the holding unit holds the plurality of output logic values up to a time point at which the holding unit holds a plurality of updated output logic values output from the logic circuit after the updated test input pattern is input to the logic circuit.

3. The fault detection system according to claim 1, further comprising a control unit configured to control a period of time from a time point at which the holding unit holds the output logic values up to a time point at which the holding unit holds a plurality of updated output logic values output from the logic circuit after the updated test input pattern is input to the logic circuit.

4. The fault detection system according to claim 1, further comprising:
a calculation unit configured to calculate a fault detection contribution value for each output logic value held by the individual holding units; and
a priority judgment unit configured to judge a priority for each individual holding unit based on the contribution value,
wherein the first acquisition unit is configured to selectively acquire a predetermined number of output logic values selected based on their priority from among the output logic values held by the plurality of individual holding units.

5. The fault detection system according to claim 1, further comprising:
a first compressing unit configured to compress data size of the output logic value; and
a first storage unit configured to store the output logic value,
wherein, in synchronization with an acquisition operation of the first acquisition unit, the first compressing unit is configured to compress the output logic value acquired by the first acquisition unit, and the first storage unit is configured to store the output logic value compressed by the first compressing unit.

6. An acquisition apparatus configured to acquire a part of or otherwise all of a plurality of output logic values output from a logic circuit after a test input pattern is input to the logic circuit,
wherein the plurality of output logic values are held by a holding unit configured to hold logic values, and are input to the logic circuit as an updated test input pattern,
and wherein the holding unit comprises a plurality of individual holding units each configured to hold a single logic value,
and wherein a part of or otherwise all of the output logic values respectively held by the plurality of individual holding units are acquired directly such that each output logic value is acquired from the corresponding individual holding unit without passing through the other individual holding units,
the acquisition apparatus further comprising:
a calculation unit configured to calculate a fault detection contribution value for each output logic value held by the individual holding units; and
a priority judgment unit configured to judge a priority for each individual holding unit based on the contribution value,
wherein the acquisition apparatus is configured to selectively acquire a predetermined number of output logic values selected based on their priority from among the output logic values held by the plurality of individual holding units.

7. A fault detection method for detecting a fault in a logic circuit based on a plurality of output logic values output from the logic circuit after a test input pattern is input to the logic circuit, the fault detection method comprising:
first inputting, in which an initial test input pattern is input to the logic circuit;
holding, in which a holding unit comprising a plurality of individual holding units each configured to hold a single logic value holds the plurality of output logic values;
second inputting, in which the plurality of output logic values held by the holding unit are input to the logic circuit as an updated test input pattern;
first acquiring, in which a part of or otherwise all of the plurality of output logic values respectively held by the plurality of individual holding units are acquired directly such that each output logic value is acquired from the corresponding individual holding unit without passing through the other individual holding units, in a period of time from a time point at which the holding unit holds the plurality of output logic values up to a time point at which the holding unit holds a plurality of updated output logic values output from the logic circuit after the updated test input pattern is input to the logic circuit;

first comparing, in which the output logic values acquired in the first acquiring are compared with output logic values expected when no fault is present in the logic circuit or otherwise an output logic value expected when a specific fault is present in the logic circuit;

second acquiring, in which a part of or otherwise all of the plurality of output logic values respectively held by the plurality of individual holding units are acquired via a different individual holding unit;

second comparing, in which the output logic values acquired in the second acquiring are compared with output logic values expected when no fault is present in the logic circuit or otherwise an output logic value expected when a specific fault is present in the logic circuit; and judging whether or not there is a fault in the logic circuit based on a comparison result obtained in the first comparing and the second comparing, and wherein a number of times the output logic values are acquired in the first acquiring is greater than a number of times the output logic values are acquired in the second acquiring.

8. The fault detection method according to claim 7, further comprising:

first compressing, in which the output logic value acquired in the first acquiring is compressed in synchronization with the first acquiring; and first storing, in which the output logic value compressed in the first compressing is stored, wherein the first compressing and the first storing are provided between the first acquiring and the second acquiring, and wherein a sequence from the holding up to the first storing is repeatedly performed a predetermined number of times.

9. The fault detection method according to claim 8, further comprising controlling in which a control unit controls a period of time from a time point at which the holding unit holds the output logic values up to a time point at which the holding unit holds a plurality of updated output logic values output from the logic circuit after the updated test input pattern is input to the logic circuit, wherein the controlling is provided between the first storing and the holding.

10. The fault detection method according to claim 9, wherein, in the controlling, the control unit performs a control operation so as to reduce a period of time from a time point at which the holding unit holds the output logic values up to a time point at which the holding unit holds a plurality of updated output logic values output from the logic circuit after the updated test input pattern is input to the logic circuit.

11. A non-transitory computer-readable medium storing a computer program configured to instruct a computer connected to a holding unit to execute a fault detection method for detecting a fault in a logic circuit based on a plurality of output logic values output from the logic circuit after a test input pattern is input to the logic circuit, the fault detection method comprising:

first inputting, in which an initial test input pattern is input to the logic circuit;

holding, in which the holding unit comprising a plurality of individual holding units each configured to hold a single logic value holds the plurality of output logic values;

second inputting, in which the plurality of output logic values held by the holding unit are input to the logic circuit as an updated test input pattern;

first acquiring, in which a part of or otherwise all of the plurality of output logic values respectively held by the plurality of individual holding units are acquired directly such that each output logic value is acquired from the corresponding individual holding unit without passing through the other individual holding units, in a period of time from a time point at which the holding unit holds the plurality of output logic values up to a time point at which the holding unit holds a plurality of updated output logic values output from the logic circuit after the updated test input pattern is input to the logic circuit;

first comparing, in which the output logic values acquired in the first acquiring are compared with output logic values expected when no fault is present in the logic circuit or otherwise an output logic value expected when a specific fault is present in the logic circuit;

second acquiring, in which a part of or otherwise all of the plurality of output logic values respectively held by the plurality of individual holding units are acquired via a different individual holding unit;

second comparing, in which the output logic values acquired in the second acquiring are compared with output logic values expected when no fault is present in the logic circuit or otherwise an output logic value expected when a specific fault is present in the logic circuit; and judging whether or not there is a fault in the logic circuit based on a comparison result obtained in the first comparing and the second comparing, and wherein a number of times the output logic values are acquired in the first acquiring is greater than a number of times the output logic values are acquired in the second acquiring.

12. A fault detection system configured to detect a fault in a logic circuit based on a plurality of output logic values output from the logic circuit after a test input pattern is input, wherein the plurality of output logic values are input to the logic circuit as an updated test input pattern, the fault detection system comprising:

a first acquisition unit configured to acquire a part of or otherwise all of the plurality of output logic values;

a comparison unit configured to compare an output logic value acquired by the first acquisition unit with an output logic value expected when no fault is present in the logic circuit or otherwise an output logic value expected when a fault is present in the logic circuit; and a fault judgment unit configured to judge whether or not there is a specific fault in the logic circuit, based on a comparison result obtained by the comparison unit, wherein the plurality of output logic values are held by a holding unit comprising a plurality of individual holding units each configured to hold a single logic value, wherein the first acquisition unit is configured to acquire a part of or otherwise all of the plurality of output logic values held by the holding unit, and wherein a part of or otherwise all of the output logic values respectively held by the plurality of individual holding units are acquired directly such that each output logic value is acquired from the corresponding individual holding unit without passing through the other individual holding units, the fault detection system further comprising:
a calculation unit configured to calculate a fault detection contribution value for each output logic value held by the individual holding units; and
a priority judgment unit configured to judge a priority for each individual holding unit based on the contribution value,
wherein the first acquisition unit is configured to selectively acquire a predetermined number of output logic values selected based on their priority from among the output logic values held by the plurality of individual holding units.

* * * * *